United States Patent
Williamson et al.

(10) Patent No.: US 7,421,642 B2
(45) Date of Patent: Sep. 2, 2008

(54) METHOD AND APPARATUS FOR ERROR DETECTION

(75) Inventors: Clifton James Williamson, Soquel, CA (US); Peter Igorevich Vasiliev, Cupertino, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 666 days.

(21) Appl. No.: 10/617,627

(22) Filed: Jul. 10, 2003

(65) Prior Publication Data
US 2004/0010742 A1    Jan. 15, 2004

Related U.S. Application Data

(63) Continuation-in-part of application No. 10/390,996, filed on Mar. 17, 2003, now abandoned.

(60) Provisional application No. 60/370,352, filed on Apr. 5, 2002.

(51) Int. Cl.
H03M 13/03 (2006.01)

(52) U.S. Cl. .................... 714/785; 714/746; 714/768; 714/782

(58) Field of Classification Search .......... 714/768, 714/782, 784–785, 746, 758
See application file for complete search history.

(56) References Cited

U.S. PATENT DOCUMENTS

| | | | | |
|---|---|---|---|---|
| 3,949,208 A * | 4/1976 | Carter | .................. | 714/765 |
| 4,998,253 A * | 3/1991 | Ohashi et al. | ............... | 714/791 |
| 5,291,496 A * | 3/1994 | Andaleon et al. | ........... | 714/703 |
| 5,771,244 A * | 6/1998 | Reed et al. | .................. | 714/752 |
| 5,905,740 A * | 5/1999 | Williamson | ................. | 714/784 |
| 6,026,420 A | 2/2000 | DesJardins et al. | .......... | 708/492 |
| 6,058,500 A | 5/2000 | DesJardins et al. | .......... | 714/781 |
| 6,061,826 A | 5/2000 | Thirumoorthy et al. | ..... | 714/784 |
| 6,167,551 A * | 12/2000 | Nguyen et al. | ............... | 714/770 |
| 6,219,815 B1 | 4/2001 | DesJardins et al. | .......... | 714/781 |
| 6,263,470 B1 | 7/2001 | Hung et al. | ................. | 714/784 |
| 6,622,268 B2 * | 9/2003 | Holman | ...................... | 714/701 |
| 6,799,293 B2 * | 9/2004 | Peters et al. | ................ | 714/763 |
| 6,990,624 B2 * | 1/2006 | Dohmen et al. | ............. | 714/785 |

* cited by examiner

Primary Examiner—Guy J. Lamarre
(74) Attorney, Agent, or Firm—Shumaker & Sieffert, P.A.

(57) ABSTRACT

The present invention is an error detection and correction scheme that enables the use of Horner's algorithm for the computation of EDC syndromes from the computed error pattern. Specifically, "transformed" EDC syndromes are computed during the read back of data and parity from the medium. The transformed syndromes are values of the polynomial whose coefficients occur in reverse order from that of the EDC codeword polynomial. In essence, by reversing the order of the coefficients, the Chien search processes the terms in descending order which is the right direction for Horner evaluation.

16 Claims, 21 Drawing Sheets

Encoder for a Polynomial Code

Encoder for a Concatenated System

METHOD AND APPARATUS FOR ERROR DETECTION

RELATED APPLICATIONS

This application is a continuation-in-part application of U.S. application Ser. No. 10/390,996, filed on Mar. 17, 2003 now abandoned, which claims priority of U.S. provisional application Ser. No. 60/370,352, filed Apr. 5, 2002.

FIELD OF THE INVENTION

This application relates generally to data communication and/or storage, and more particularly to error detection.

BACKGROUND OF THE INVENTION

In the field of digital data storage, data reliability is critical. Specifically, it is important that the user data that are retrieved from a medium match the data that were written to and stored on the medium. For a variety of reasons, the retrieved data may differ from the data that were originally stored. Any differences between the stored data and the retrieved data are considered errors in the data. Traditional methods for ensuring data reliability have included error detection and error correction. Typical error detection and correction techniques involve appending parity bits to the user data during an encoding process to form a code word prior to storage. When the code word (user data with parity bits) is later retrieved from the medium, it is decoded, whereby the parity bits are used to detect and correct errors. Essentially, the parity symbols provide redundancy, which may be used to check that the data were read correctly from the medium.

Digital data is typically partitioned into a number of symbols, each consisting of a fixed number of bits. For example, in the field of data storage, 8-bit symbols or "bytes" are commonly used. An h-bit symbol may be viewed as an element of the Galois Field $GF(2^h)$, which is a finite field having unique mathematical properties. By treating the data as Galois field elements, mathematical operations may be performed on the symbols in a data storage device to reach useful results, including checking for errors. Error detection and correction algorithms, such as those used with the well-known Reed-Solomon (RS) codes, take advantage of the mathematical properties of Galois Fields. An error correction algorithm is able to correct up to a maximum number of symbol errors. The maximum number of symbol errors that the algorithm can correct is referred to as the "correction power" of the code. Error correction algorithms are able to correct errors primarily because a limited number of data blocks constitute the valid code words that may be stored on the medium.

Typically, before user data is stored, it is first encoded with parity symbols for the sole purpose of error detection. These parity symbols are computed from the user data and the block of data consisting of the user data and the parity symbols forms a code word in an error detection code (EDC). The parity symbols will be referred to as EDC parity and the block of data together with its EDC parity will be referred to as an EDC codeword. (For many classes of codes, such as the RS codes, the code symbols are viewed as elements of a Galois field and the code word is viewed as a polynomial whose coefficients are those Galois field elements. The defining property of the code is that certain values of these polynomials are equal to zero. These codes are called "polynomial codes".)

In addition, the user data and EDC parity (EDC codeword) may be encoded with additional parity symbols for the purpose of error correction. These parity symbols are computed from the user data and EDC parity and the block of data consisting of the user data, the EDC parity, and the additional parity symbols form a code word in an error correction code (ECC). The additional parity symbols will be referred to as ECC parity. The entire block of data together with its EDC parity and ECC parity will be referred to as an ECC codeword. During decoding, while the erroneous data is retrieved, two sets of "syndromes", one associated with the EDC and the other associated with the ECC, are computed. The two sets of syndromes are referred to as the EDC syndromes and the ECC syndromes. In the case of polynomial codes, these syndromes are the polynomial values used to define the codes, which are equal to zero when the data block constitutes a valid codeword. Thus, if the EDC syndromes are non-zero, i.e. if any bit in any syndrome is 1, an error has occurred in the EDC codeword. Similarly if the ECC syndromes are non-zero, an error has occurred in the ECC codeword. Furthermore, if an error is identified by the ECC syndromes, an error correction algorithm may then use the ECC syndromes to attempt to correct the error.

A typical error correction algorithm applies a minimum distance rule, in which a block of data containing errors (an "invalid" or "corrupted" codeword) is changed to the "closest" valid codeword. The "distance" between two blocks of data is the number of symbols in which the blocks differ, so that the closest codeword to a block of data is the codeword which differs from that block in as few symbols as possible. This is referred to as "maximum likelihood decoding" because an error event in which a small number of symbols are corrupted is generally more likely to occur than an event in which a large number of symbols are corrupted. However, in some cases, for example when massive data corruption occurs, the closest codeword to a corrupted codeword may not be the codeword originally written to the storage medium. In this instance, the algorithm will still "correct" the codeword to the closest valid codeword. Such a "miscorrection" results in an undetected corruption of user data. Clearly, a robust error control system must include mechanisms that guard against miscorrections. One such mechanism is contained in the error correction algorithm itself: generally when an error event beyond the correction power of a code occurs, then with high probability the algorithm will detect that the errors are uncorrectable. A second mechanism against miscorrection is the EDC. If the error correction algorithm has restored a corrupted codeword to the codeword originally written to the medium, then in particular the user data and EDC parity symbols have been restored. Thus, if the EDC syndromes are recomputed from the corrected data, they will all be zero. If a (possibly erroneous) correction has been performed and the recomputed EDC syndromes are not all zero, then the EDC has detected a miscorrection. In this way, the EDC reduces the likelihood of undetected data corruption even further.

Current approaches to decoding data involve implementations of Horner's algorithm, a key equation solver, a Chien search, and Forney's algorithm. Horner's algorithm is a method for evalutating polynomials and is used to compute the polynomial values that comprise the EDC and ECC syndromes. An error locator polynomial and an error evaluator polynomial are computed from the ECC syndromes by a key equation solver, such the Berlekamp-Massey algorithm. The roots of the error locator polynomial are Galois field elements, which correspond to locations of errors in the ECC codeword. The roots of the polynomial, and hence the locations of the errors, can be computed by a systematic search called a Chien search. Once an error location has been identified, the "error value" needed to correct the error can be computed by Forney's algorithm. It is desirable to use Horner's algorithm to recompute EDC syndromes after error correction has been performed, but current approaches have a number of drawbacks.

One approach is to store the corrupted user data and EDC parity symbols in a buffer, perform corrections on the data in the buffer, and then recompute the EDC syndromes as the corrected data are read from the buffer. In this case all the EDC syndromes should be zero. The drawback to this approach is the latency it adds to the system. Syndrome computation will not be complete until the last code symbol has been read from the buffer and at that point user data may already have been transferred to the host computer system. The host system must then be informed to disregard the data it has received. This is undesirable even though the storage device will most likely recover the data through a retry methodology such as rereading the data from the storage medium. To avoid additional system latency, it is desirable to recompute the EDC syndromes in parallel with the Chien search, so that the EDC will detect an ECC miscorrection before any user data have been transferred to the host. This approach is facilitated by the fact that the EDC syndromes can be computed from the error locations and values alone, instead of from the entire block of corrupted data. In this methodology, the EDC syndromes computed from the correction pattern are compared with the syndromes that were computed when the corrupted data were originally read from the medium. If the two sets of syndromes do not match, then the correction pattern does not match the actual error pattern and thus a mis-correction has been detected.

While it would be desirable to use Horner's algorithm to recompute the EDC syndromes from the error pattern, a difficulty arises from the order in which Horner's algorithm and the Chien search process codeword symbols. When a codeword is treated as a polynomial with Galois field coefficients, the coefficients of highest order are the first to be written to or read from the medium. This enables the use of Horner's algorithm, which processes the polynomial coefficients in descending order. However, the simplest implementation of a Chien search processes the locations corresponding to polynomial terms in ascending order, which is the "wrong direction" for Horner evaluation. The EDC syndromes can be computed from the error pattern by other methods, which require hardware more expensive than that for Horner evaluation.

It is with respect to these and other considerations that the present invention has been developed.

SUMMARY OF THE INVENTION

One of the purposes of the present invention is to enable the use of Horner's algorithm for the computation of EDC syndromes from the computed error pattern. Specifically, "transformed" EDC syndromes are computed during the read back of data and parity from the medium. The transformed syndromes are values of the polynomial whose coefficients occur in reverse order from that of the EDC codeword polynomial. By reversing the order of the coefficients, the Chien search now processes the terms in descending order which is the right direction for Horner evaluation.

The present invention is described with specific reference to data storage on a magnetic medium. It is to be understood, however, that the present invention applies equally to data storage/retrieval from any type of medium for digital data storage and applies to data transmission or transfer systems and methods from one point to another with confirmation of data integrity, e.g., in which error detection and correction are needed.

These and various other features as well as advantages which characterize the present invention will be apparent from a reading of the following detailed description and a review of the associated drawings.

DETAILED DESCRIPTION

Embodiments of the present invention are described with reference to a series of figures. Generally, embodiments of the present invention relate to data transmission systems and methods and those systems and methods, for example, incorporated in a data storage device, such as a disc drive, for decoding data that are retrieved from a storage medium in the storage device. More particularly, embodiments relate to detecting errors in retrieved data to determine whether to correct the data and/or retrieve the data again. More particularly still, embodiments relate to performing error detection on data that has been corrected in parallel with identifying errors in the data. By validating 'corrected' data while retrieved data is being corrected, performance may be improved while the likelihood of passing incorrect data to a host computer is substantially reduced.

Figure 1:
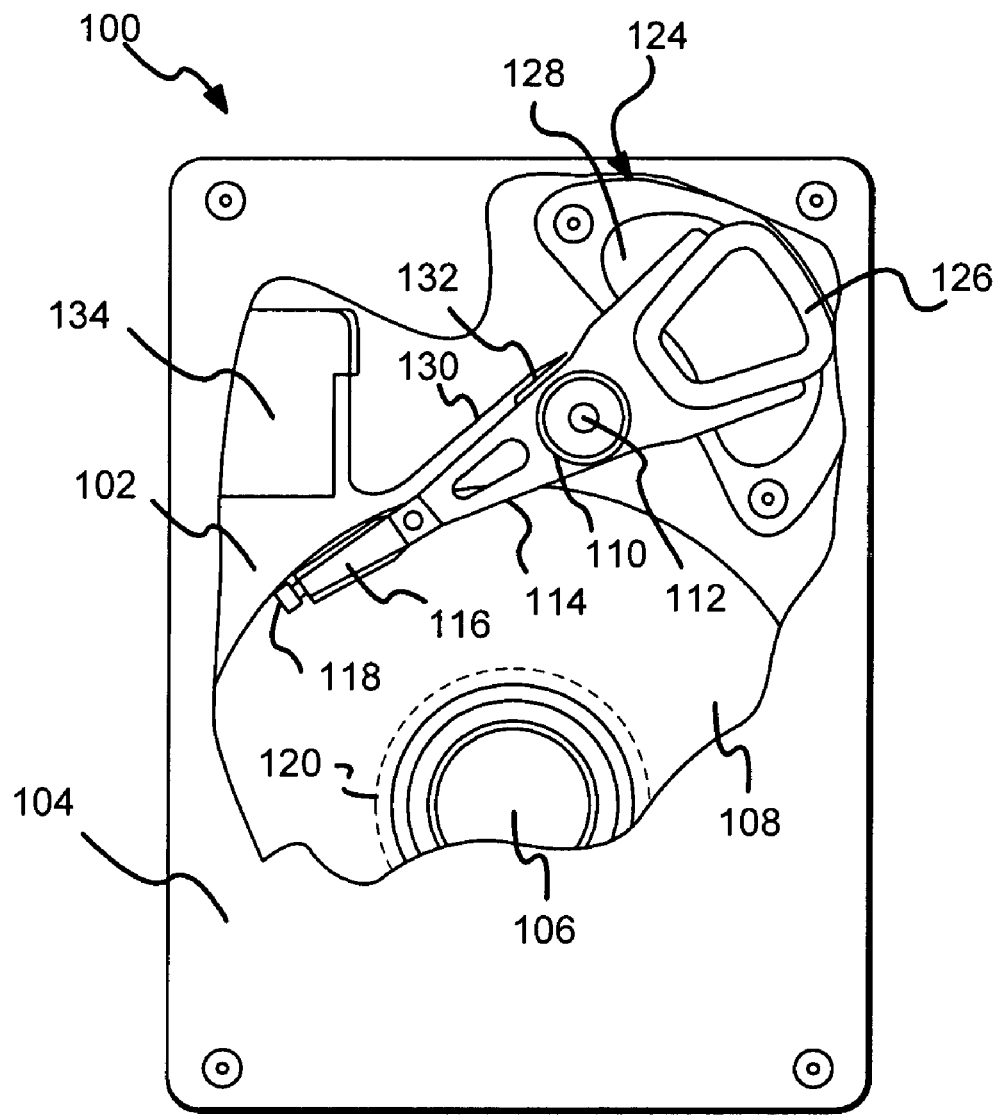
FIG. 1 is a plan view of a disc drive incorporating a preferred embodiment of the present invention showing the primary internal components.

A disc drive 100 incorporating a preferred embodiment of the present invention is shown in FIG. 1. The disc drive 100 includes a baseplate 102 to which various components of the disc drive 100 are mounted. A top cover 104, shown partially cut away, cooperates with the baseplate 102 to form an internal, sealed environment for the disc drive in a conventional manner. The components include a spindle motor 106, which rotates one or more discs 108 at a constant high speed. Information is written to and read from tracks on the discs 108 through the use of an actuator assembly 110, which rotates during a seek operation about a bearing shaft assembly 112 positioned adjacent the discs 108. The actuator assembly 110 includes a plurality of actuator arms 114 which extend towards the discs 108, with one or more flexures 116 extending from each of the actuator arms 114. Mounted at the distal end of each of the flexures 116 is a read/write transducer head 118, which includes an air bearing slider enabling the head 118 to fly in close proximity above the corresponding surface of the associated disc 108.

During a seek operation, the track position of the heads 118 is controlled through the use of a voice coil motor (VCM) 124, which typically includes a coil 126 attached to the actuator assembly 110, as well as one or more permanent magnets 128 which establish a magnetic field in which the coil 126 is immersed. The controlled application of current to the coil 126 causes magnetic interaction between the permanent magnets 128 and the coil 126 so that the coil 126 moves in accordance with the well-known Lorentz relationship. As the coil 126 moves, the actuator assembly 110 pivots about the bearing shaft assembly 112, and the heads 118 are caused to move across the surfaces of the discs 108.

The spindle motor 106 is typically de-energized when the disc drive 100 is not in use for extended periods of time. The heads 118 are moved over park zones 120 near the inner diameter of the discs 108 when the drive motor is de-energized in this exemplary embodiment. The heads 118 are secured over the park zones 120 through the use of an actuator latch arrangement, which prevents inadvertent rotation of the actuator assembly 110 when the heads are parked.

A flex assembly 130 provides the requisite electrical connection paths for the actuator assembly 110 while allowing pivotal movement of the actuator assembly 110 during operation. The flex assembly includes a printed circuit board 132 to which head wires (not shown) are connected; the head wires being routed along the actuator arms 114 and the flexures 116 to the heads 118. The printed circuit board 132 typically includes circuitry for controlling the write currents applied to the heads 118 during a write operation and a preamplifier for amplifying read signals generated by the heads 118 during a read operation. The flex assembly terminates at a flex bracket 134 for communication through the baseplate 102 to a disc drive printed circuit board (not shown) mounted to the bottom side of the disc drive 100.

In the exemplary embodiment shown in FIG. 1, the write portion of the transducer head 118 in combination with current-controlling circuitry may generally be referred to as a communication module for communicating data onto the disc 108. The read portion of the transducer head 118 in combination with the preamplifier may be referred to as a retrieving module, whereby data is retrieved from the disc 108. In general, a communication module includes any hardware, software, and/or firmware operable to communicate data via or to a medium. Likewise, in general, a retrieving module includes any hardware, software, and/or firmware operable to receive data from the media. While embodiments described herein are directed at use in a disc drive, it is to be understood that other types of media, such as communications channels, and devices, such as transmitters and receivers, may advantageously employ embodiments of the present invention.

Figure 2:
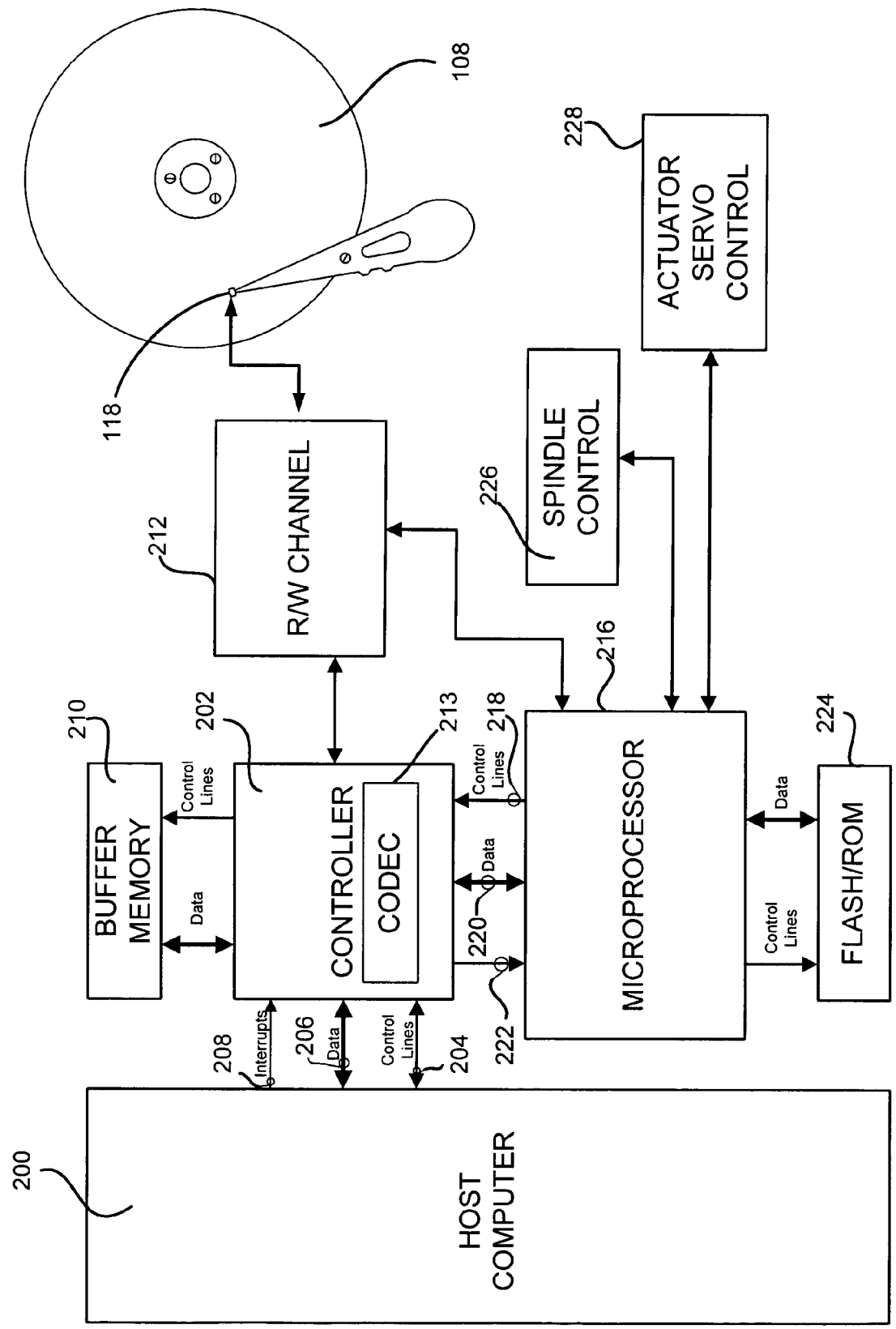
FIG. 2 is a functional block diagram of the disc drive of FIG. 1 interacting with a host computer in accordance with a preferred embodiment of the present invention.

Referring now to FIG. 2, shown therein is a functional block diagram of the disc drive 100 of FIG. 1, generally showing the main functional circuits which are typically resident on a disc drive printed circuit board and which are used to control the operation of the disc drive 100. As shown in FIG. 2, the host 200 is operably connected to a controller ASIC (application specific integrated circuit) 202 via control lines 204, data lines 206, and interrupt lines 208. The controller 202 typically includes an associated buffer 210, which facilitates high-speed data transfer between the host 200 and the disc drive 100. Data to be written to the disc drive 100 are passed from the host to the controller 202 and then to a read/write channel 212, which encodes and serializes the data.

The controller 202 includes a coder/decoder (CODEC) 213 for encoding and decoding data. The CODEC 213 employs unique systems and methods for ensuring data reliability and timing recovery for a given code rate. Embodiments of the CODEC 213 are described with reference to functional block diagrams and operation flow diagrams in more detail below.

The read/write channel 212 also provides the requisite write current signals to the heads 118. To retrieve data that have been previously stored by the disc drive 100, read signals are generated by the heads 118 and provided to the read/write channel 212, which processes and outputs the retrieved data to the controller 202 for subsequent transfer to the host 200. Such operations of the disc drive 100 are well known in the art and are discussed, for example, in U.S. Pat. No. 5,276,662 issued Jan. 4, 1994 to Shaver et al.

As also shown in FIG. 2, a microprocessor 216 is operably connected to the controller 202 via control lines 218, data lines 220, and interrupt lines 222. The microprocessor 216 provides top level communication and control for the disc drive 100 in conjunction with programming for the microprocessor 216 which is typically stored in a microprocessor memory (MEM) 224. The MEM 224 can include random access memory (RAM), read only memory (ROM) and other sources of resident memory for the microprocessor 216. Additionally, the microprocessor 216 provides control signals for spindle control 226, and servo control 228.

Figure 3:
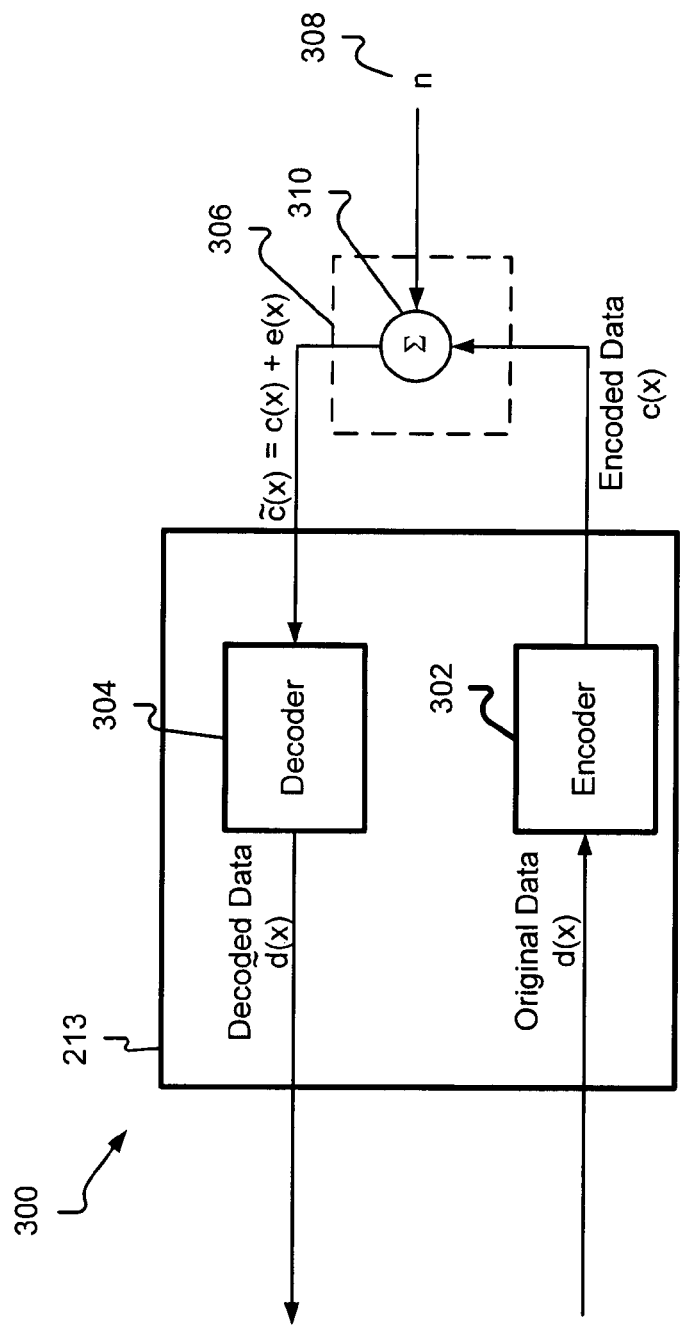
FIG. 3 illustrates an embodiment of a data transfer system that may be employed and the disc drive of FIG. 1.

A data transfer system 300 in accordance with the invention is illustrated in FIG. 3. The data transfer system 300 includes one embodiment of the CODEC 213 (FIG. 2) in combination with a data transfer medium 306. In this particular embodiment, the CODEC 213 includes an encoder 302, and a decoder 304, which encode and decode data respectively. The encoder 302 receives input data, d(x), and outputs encoded data, c(x). The encoded data, c(x), is communicated via a data transfer medium 306. The data transfer medium 306 may be any communication channel, storage medium, or any other data transfer mechanism as may be known in the art. For example, the data transfer medium 306 may be a magnetic disc such as the disc 108 of FIG. 1.

One characteristic of the data transfer medium 306 is the existence of noise or other disturbance that may impart errors in the encoded data, c(x). Noise as used herein refers to any phenomenon, random, deterministic, or otherwise, which is associated with the transfer of data from the medium 306, and which tends to cause information (e.g., bits) in the encoded data to change. Thus, data transfer from/to the medium 306 imparts noise 308 upon the encoded data, c(x). In the diagram shown in FIG. 3, the medium 306 is abstracted as including an addition function 310, whereby the noise 308 is added to the encoded data, c(x). It is to be understood, however, that in general, noise can have other effects upon c(x) besides, or in combination with, additive effects.

Noise may be imparted on data in the disc drive 100 at any point along the data path. By way of example, and not limitation, the data transfer medium 306 in the disc drive 100 may include the disc 108 shown in FIG. 2. The data transfer medium 306 may further include the read/write channel 212 and the read/write head 118. After data are written to the disc 108, disturbances in the disc drive 100 may cause errors to arise in the data stored on the disc 108. Additionally, noise 308 may cause errors to arise in data as the data are being read from the disc 108. Thus, noise 308 may be imparted upon data when the data are in the read/write channel 212 before or after the data are written to the disc 108.

Errors resulting from noise as the data are read from the medium are often called read errors and may be detected using an embodiment of the present invention. Once detected, the read errors may be corrected or, if it is not possible to correct the read errors, the data may be retrieved again from the disc through retry operations. In an embodiment where the data transfer medium 306 is a data disc 108, a number of factors may contribute to the noise 308. For example, the head (e.g., the head 118 of FIG. 1) may not be centered on the center of the data track from which data are being read. When the head 118 is not centered properly, data may not be read properly. Often, if read errors occur because of improper head position, the head may be repositioned to be more in line with the track center to improve data reading. Many other conditions (besides head mispositioning) may arise in a disc drive, which may cause data to be improperly read from the disc.

Figure 13:
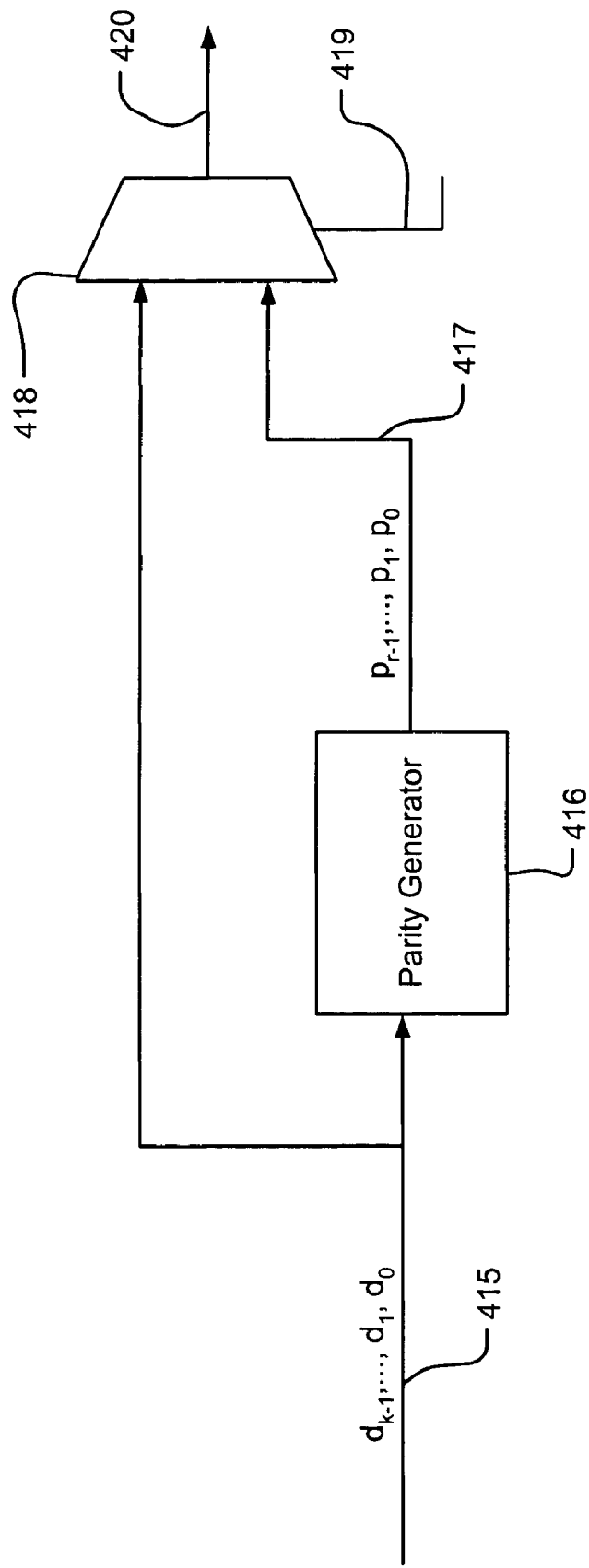
FIG. 13 is an exemplary circuit for a polynomial code encoder.

FIG. 13 illustrates a hardware implementation of a standard encoder for a systematic polynomial code, which is well understood by someone skilled in the art. The user data to be encoded 415 are partitioned into k data symbols $d_{k-1}$, $d_{k-2}, \ldots, d_1, d_0$. Each symbol consists of h bits and is viewed as an element of the Galois field GF($2^h$). The user data 415 are the inputs to a parity generator 416, which reads one symbol per clock cycle starting with $d_{k-1}$ and ending with $d_0$, so that the transfer of the data symbols lasts k clock cycles. The outputs 417 of the parity generator 416 are partitioned into r parity symbols $p_{r-1}$, $p_{r-2}, \ldots, p_1, p_0$. Again each symbol consists of h bits and is viewed as an element of the Galois field GF($2^h$). The parity symbols 417 are transferred from the parity generator 416 one symbol per clock starting with $p_{r-1}$ and ending with $p_0$. The transfer of the parity symbols 417 begins immediately after the last data symbol $d_0$ has been transferred and lasts r clock cycles. The data symbols 415 and the parity symbols 417 are the inputs to a multiplexer 418. When the user data symbols 415 are read by the parity generator 416, they also pass through the multiplexer 418 and are the outputs 420 of the encoder block. When the parity symbols 417 are transferred from the parity generator 416, then they pass through the multiplexer 418 and are the outputs 420 of the encoder block. During the first k clock cycles of the transfer, a control signal 419 determines that the outputs 420 are user data symbols. During the next r clock cycles, the control signal 419 determines that the outputs 420 are parity symbols. In this way, the outputs 420 constitute a codeword, whose transfer takes k+r clock cycles. The outputs 420 of the encoder block are written to a storage medium or may be inputs to another block in the error control system.

Figure 4:
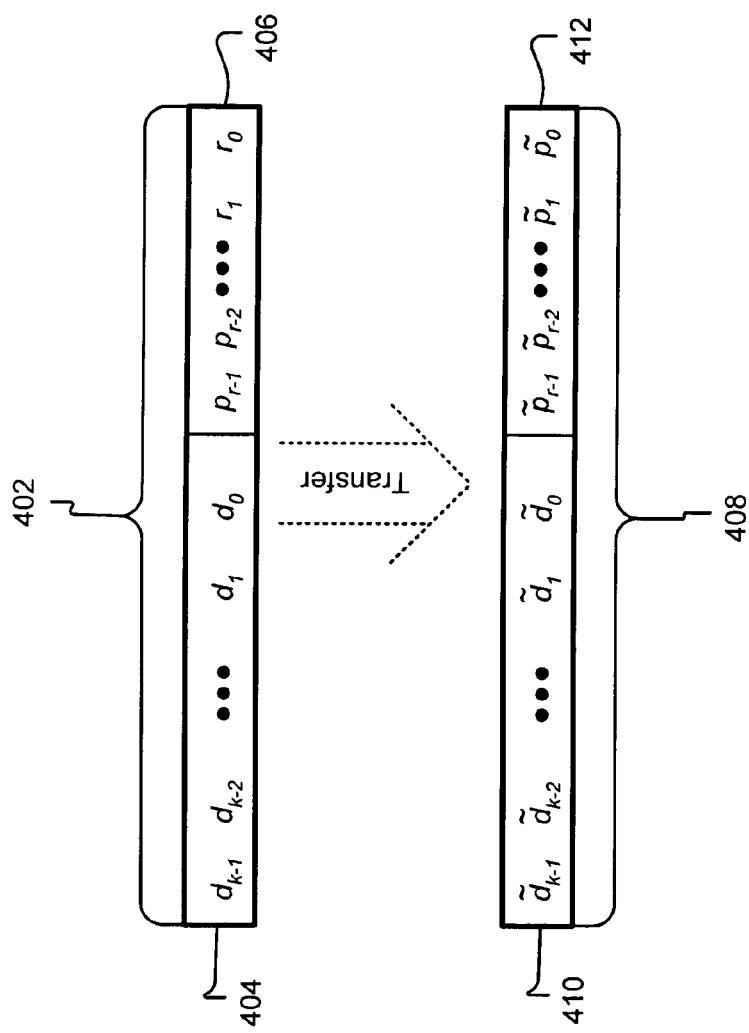
FIG. 4 illustrates exemplary code words that may be transferred and analyzed for errors in an embodiment of the present invention.

FIG. 4 illustrates the case where the data and parity symbols are transferred to the medium (e.g., storage medium or communication medium), in the form of an original codeword 402. The original codeword 402 is made up of two portions. The first portion 404 consists of user data. The user data are the series of data symbols, $d_{k-1}$, $d_{k-2}$, and so on. The second portion 406 includes parity symbols $p_{r-1}$, $p_{r-2}$, and so on.

The original codeword 402 is transferred to a medium, such as a magnetic disc. The original codeword 402 is later retrieved from the medium and decoded to detect any errors. After the original codeword 402 is retrieved, it is represented as a retrieved codeword 408. The retrieved code word 408 may differ from the original codeword 402 because read errors or other errors may arise. The retrieved codeword 408 is made up of retrieved user data 410 and retrieved parity data 412. The retrieved user data 410 include retrieved user symbols, $\tilde{d}_{k-1}$, $\tilde{d}_{k-2}$, and so on. The retrieved parity data 412 include retrieved parity symbols $\tilde{p}_{r-1}$, $\tilde{p}_{r-2}$, and so on. The retrieved parity data 412 are used to detect errors in symbols of the retrieved codeword 408.

As is shown in more detail below, the retrieved symbols of the retrieved user data 410 and the retrieved parity data 412 are used to calculate syndromes. The values of the syndromes indicate whether any bits in the retrieved code word 408 differ from the code word 402, and hence whether errors have arisen in the retrieved code word 408.

Referring to FIG. 3 and FIG. 4 together, the decoder 304 retrieves the transferred encoded data $\tilde{c}(x)$ 408 from the channel 306 as it may have been changed by the medium and/or misread. The decoder 304 uses the retrieved parity data $\tilde{p}(x)$ 412 to determine the user data d(x) 404 from the retrieved codeword $\tilde{c}(x)$ 408. The retrieved parity $\tilde{p}(x)$ 412 is the original parity p(x) including any changes to p(x) due to the channel 306 or a misread. The output of the decoder 304 is $\tilde{d}(x)$ 410, which may differ from d(x) 404 if uncorrectable errors were imparted on c(x) 402 as it was transferred over the medium 306 and/or retrieved from the medium 306. The decoder 304 is designed to be able to correct up to a specified number of errors; however, if more errors occur than the specified number, then the decoder 304 may not be able to derive d(x) 404, but rather $\tilde{d}(x)$ 410. As such, $\tilde{d}(x)$ 410 may differ from d(x) 404.

Transferred data, such as the data illustrated in FIG. 4, may be represented as a polynomial. This polynomial is generally a summation of products of elements from a Galois field GF($2^h$) with a power of a variable x. The polynomial representation will assist the reader in understanding the significant utility of embodiments of the present invention. Thus, user data d(x) 404 may be represented as a "data polynomial" as shown in equation (1) below.

$$d(x) = d_{k-1}x^{k-1} + d_{k-2}x^{k-2} + \ldots + d_2x^2 + d_1x^1 + d_0 \qquad (1)$$

In general, d(x) 404 represents a series of symbols represented by the coefficients, $d_i$. Each coefficient, $d_i$, represents the $i^{th}$ symbol in d(x) 404, and a power $x^i$ of a variable x holds the place of each coefficient, $d_i$, according to the order of the coefficient in the data block. The coefficient $d_{k-1}$ is the first symbol in the block and $d_0$ is the last.

Likewise, the original parity p(x) 406 may be represented as a "parity polynomial" as shown in equation (2) below:

$$p(x)=p_{r-1}x^{r-1}+p_{r-2}x^{r-2}+\ldots+p_2x^2+p_1x^1+p_0, \quad (2)$$

where r parity symbols $p_i$ are computed based on the user data d(x) 404 and the particular encoding algorithm being used. During encoding, the r parity symbols $p_i$ are appended to the data d(x) 404 to create the original codeword c(x) 402. The data, d(x), is input into the encoder 404 for error detection/correction encoding. The encoder calculates parity symbols and appends the symbols onto the data block d(x). The output of the ECC encoder is an encoded data block c(x). For example, the encoder 404 may employ a Reed-Solomon (RS) encoding algorithm.

The original codeword c(x) 402 can similarly be represented as a "codeword polynomial" as shown in equation (3) below:

$$c(x)=d(x)x^r+p(x)=d_{k-1}x^{r+k-1}+\ldots+d_0x^r+p_{r-1}x^{r-1}+\ldots+p_0. \quad (3)$$

During encoding, the parity symbols $p_i$ are chosen so that the polynomial value $c(\alpha)=0$, for all $\alpha$ in a certain subset A. The subset A typically has r elements in a Galois field, which may be $GF(2^h)$, wherein h is the number of bits per symbol, or another Galois field containing $GF(2^h)$. The symbols $p_i$ may be generated in any manner consistent with the error detection/correction algorithm being used in a particular implementation. The particular manner in which the symbols $p_i$ are calculated is not particularly relevant to an embodiment of the present invention. Thus, the particular steps, operations, and systems involved in generating the symbols $p_i$ are not discussed in detail herein. Those skilled in the art are referred to "Error-Correction Coding for Digital Communications," by Clark and Cain, for a more detailed discussion of parity symbol generation.

After the data are retrieved from the medium 306, it is assumed that errors may have been imparted on the code word c(x). Errors are represented by e(x) and are assumed to be added to the code word c(x). Thus, the retrieved data $\tilde{c}(x)$ may be represented mathematically by Equation (4) below:

$$\tilde{c}(x)=c(x)+e(x). \quad (4)$$

It will be appreciated that, by design, the value $c(\alpha)$ is equal to zero. Thus, the following is true:

$$\tilde{c}(a)=e(a). \quad (5)$$

The respective data retrieved in the data transfer system may be represented in polynomial form as shown in Equations (6), (7), and (8).

$$\tilde{d}(x)=\tilde{d}_{k-1}x^{k-1}+\tilde{d}_{k-2}x^{k-2}+\ldots+\tilde{d}_2x^2+\tilde{d}_1x^1+\tilde{d}_0, \quad (6)$$

$$\tilde{p}(x)=\tilde{p}_{r-1}x^{r-1}+\tilde{p}_{r-2}x^{r-2}+\ldots+\tilde{p}_2x^2+\tilde{p}_1x^1+\tilde{p}_0, \quad (7)$$

$$\tilde{c}(x)=\tilde{d}_{r-1}x^{r+k-1}+\ldots\tilde{d}_0x^r+\tilde{p}_{r-1}x^{r-1}+\ldots+\tilde{p}_0, \quad (8)$$

where $\tilde{d}(x)$ is the retrieved user data, which may have errors; $\tilde{p}(x)$ is the retrieved parity, which may have errors; and $\tilde{c}(x)$ is the retrieved code word.

In embodiments described herein, the logical operations of the encoder 302 and the decoder 304 may be implemented as a sequence of computer implemented steps or program modules running on a microprocessor, such as, without limitation, a processor in a personal computer, computer workstation, or a disc drive (e.g., disc drive 100). It will be understood to those skilled in the art that the encoder 302 and the decoder 304 of the present invention may also be implemented as interconnected machine logic circuits or circuit modules within a computing system. The implementation is a matter of choice dependent on the performance requirements of the computing system implementing the encoder 302 and the decoder 304.

The operations, structural devices, acts, and/or modules described herein may be implemented in software, in firmware, in special purpose digital logic, and/or any combination thereof without deviating from the spirit and scope of the present invention as recited within the claims attached hereto. Furthermore, the various software routines or software modules described herein may be implemented by any means known in the art. For example, any number of computer programming languages, such as "C", "C++", Pascal, FORTRAN, assembly language, Java, etc., may be used. By way of further example, and not limitation, any scripting language known in the art may be used, such as Korn shell script. Furthermore, various programming approaches such as procedural, object oriented or artificial intelligence techniques may be employed.

The encoder 302 and the decoder 304 may be implemented as software modules executed by a disc drive, such as the disc drive 100 illustrated in FIG. 1. As described in greater detail below, the encoder 302 may be employed to receive, store, convert, encode, and/or communicate digital data. The encoder 302 employs microprocessor readable media for carrying out the various tasks associated with encoding data and communicating the data to be retrieved and decoded by the decoder 304. Similarly the decoder 304 employs microprocessor readable media for carrying out the various tasks associated with retrieving and decoding the data.

Figure 7:
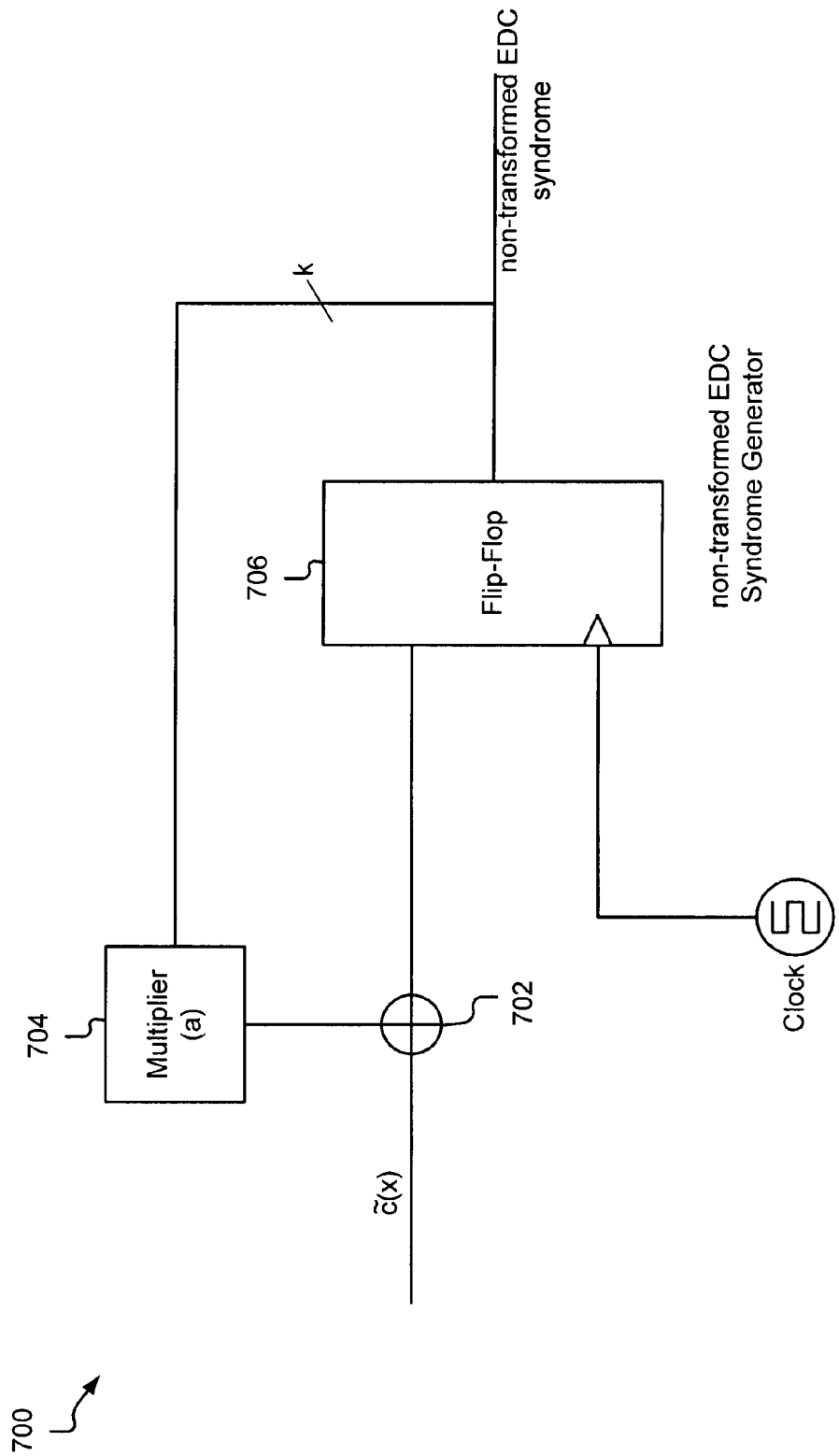
FIG. 7 illustrates a circuit diagram in accordance with an embodiment of the EDC syndrome generator of FIG. 6.

FIG. 7 illustrates a circuit 700 for computing the polynomial value $\tilde{c}(\alpha)$ in the case where the elements of A are in the Galois field $GF(2^h)$. Several such circuits are required, one for each value $\alpha$ in A. The circuit 700 includes an adder module 702, a multiplier 704, and a bank of h flip-flops 706 (one of which is shown) generally coupled together in a feedback arrangement as shown. In general, the circuit 700 evaluates the retrieved code word $\tilde{c}(x)$ at a fixed value a to yield a syndrome. The circuit 700 implements Horner's algorithm. As will be readily recognized, Horner's algorithm may be implemented with relatively simple, low-cost circuitry.

The retrieved code word $\tilde{c}(x)$ is input to an adder module 702. The adder module 702 typically includes a series of XOR gates that add the symbols in $\tilde{c}(x)$ to output from the multiplier 704. The Galois field coefficients of the retrieved code word $\tilde{c}(x)$ are preferably clocked into the circuit 700, and data are subsequently clocked through the circuit 700. In one embodiment of the adder module 702, exclusive 'or' operations are performed on the data input to the adder module. The output of the adder module 702 is clocked into the bank of flip-flops 706.

The flip-flops 706 are generally memory registers that include a bank of bits that alternate between states. It is to be understood that other types of hardware are known in the art that could be used instead of, or in combination with, the flip-flops 706. The flip-flops 706 are initialized to zero before the transfer of $\tilde{c}(x)$. The inputs to the flip-flops 706 are sequentially clocked in to the bank of bits and clocked out on a 'first-in-first-out' basis. The output of the flip-flops 706 includes an h-bit symbol that is fed into the multiplier 704.

The multiplier 704 multiplies the h-bit symbol from the flip-flops by a fixed value, $\alpha$. The multiplier 704 may include any combinational logic, or software to perform the multiplication. By way of example, and not limitation, the multiplier 704 may be implemented in a microprocessor. Other, less expensive hardware, such as off-the-shelf integrated logic circuits may be used for the multiplier 704. Those skilled in the art will recognize other types of hardware, firmware, or software readily suited to implement the multiplier 704. The output of the multiplier 704 is clocked into the adder module 702.

The circuit 700 iteratively multiplies and sums symbols of $\tilde{c}(x)$ to generate the the a syndrome. The output of the circuit 700 may be viewed as an evaluation of the equation (8) wherein x is set equal to the fixed value $\alpha$. Because a set of fixed values $\alpha$ is employed in the error detection algorithm, an embodiment of a decoder may include a plurality of circuits 700 wherein each circuit employs one of the fixed values, $\alpha$. As such, as the retrieved code word $\tilde{c}(x)$ is read from a medium (e.g., the disc 108 of FIG. 1), each symbol (coefficient) of $\tilde{c}(x)$ may be multiplexed into the circuits, one coefficient per clock cycle. Before syndrome computation begins, the value in the flip-flops 706 represents the zero element in $GF(2^h)$. As each coefficient of $\tilde{c}(x)$ is clocked into the circuit, the value in the flip-flops 706 becomes the previous value stored in the flip-flops 706 multiplied by a plus the value of the coefficient. Thus, when the first coefficient $\tilde{d}_{k-1}$ is clocked into the circuit, the value in the flip-flops 706 becomes $0 \cdot \alpha + \tilde{d}_{k-1} = \tilde{d}_{k-1}$. When the second coefficient $\tilde{d}_{k-2}$ is clocked into the circuit, the value in the flip-flops 706 becomes $\tilde{d}_{k-1} \cdot \alpha + \tilde{d}_{k-2}$. When the third coefficient $\tilde{d}_{k-3}$ is clocked into the circuit, the value in the flip-flops 706 becomes $(\tilde{d}_{k-1} \cdot \alpha + \tilde{d}_{k-2}) \cdot \alpha + \tilde{d}_{k-3} = \tilde{d}_{k-1} \cdot \alpha^2 + \tilde{d}_{k-2} \cdot \alpha + \tilde{d}_{k-3}$. When the last coefficient $\tilde{p}_0$ is clocked into the circuit, the value in the flip-flops 706 becomes $\tilde{c}(\alpha) = \tilde{d}_{k-1} \alpha^{r+k-1} + \ldots + \tilde{d}_0 \alpha^r + \tilde{p}_{r-1} \alpha^{r-1} + \ldots + \tilde{p}_0$. The computation of the syndrome is complete after the last coefficient has been clocked into the circuit.

Preferred embodiments of the present invention involve a concatenated error control system in which there are two separate codes, an EDC (error detection code) and an ECC (error correction code). User data are first encoded with "EDC parity", then with "ECC parity" and in each case the encoder is of the type described in FIG. 13. Specifically, the user data 415 again consist of k code symbols $d_{k-1}$, $d_{k-2}$, ..., $d_1$, $d_0$ each consisting of h bits, which may be viewed as the coefficients of a data polynomial d(x) as in equation (1). The EDC parity generator 416 computes r parity symbols 417 $p_{r-1}$, $p_{r-2}$, ..., $p_1$, $p_0$ which may be viewed as the coefficients of a parity polynomial p(x) as in equation (2). The codeword polynomial c(x) in equation (3) will be written as $c_{EDC}(x)$ in equation (9) to emphasize that it is a codeword in the sense of the error detection code. Thus, $$c_{EDC}(x) = d(x)x^r + p(x) = d_{k-1}x^{r+k-1} + \ldots + d_0 x^r + p_{r-1} x^{r-1} + \ldots + p_0. \quad (9)$$

The polynomial $c_{EDC}(x)$ plays the role of the data polynomial d(x) for the ECC parity generator, so that the r+k symbols $d_{k-1}$, $d_{k-2}$, ..., $d_1$, $d_0$, $p_{r-1}$, $p_{r-2}$, ..., $p_1$, $p_0$ are the inputs to the ECC parity generator. The ECC parity generator computes s parity symbols $q_{s-1}$, $q_{s-2}$, ..., $q_1$, $q_0$ which may be viewed as the coefficients of a parity polynomial q(x) as in equation (10):

$$q(x) = q_{s-1} x^{s-1} + q_{r-2} x^{s-2} + \ldots + q_2 x^2 + q_1 x^1 + q_0, \quad (10)$$

The parity symbols $q_{s-1}$, $q_{s-2}$, ..., $q_1$, $q_0$ are appended to the symbols $d_{k-1}$, $d_{k-2}$, ..., $d_1$, $d_0$, $p_{r-1}$, $p_{r-2}$, ..., $p_1$, $p_0$ to create an ECC codeword, which may be viewed as a codeword polynomial $c_{ECC(x)}$ as in equation (11):

$$c_{ECC}(x) = c_{EDC}(x)x^s + q(x) \quad (11)$$

$$= d_{k-1} x^{r+s+k-1} + \ldots + d_0 x^{r+s} + p_{r-1} x^{r+s-1} + \ldots +$$

$$p_0 x^s + q_{s-1} x^{s-1} + \ldots + q_0.$$

Figure 14:
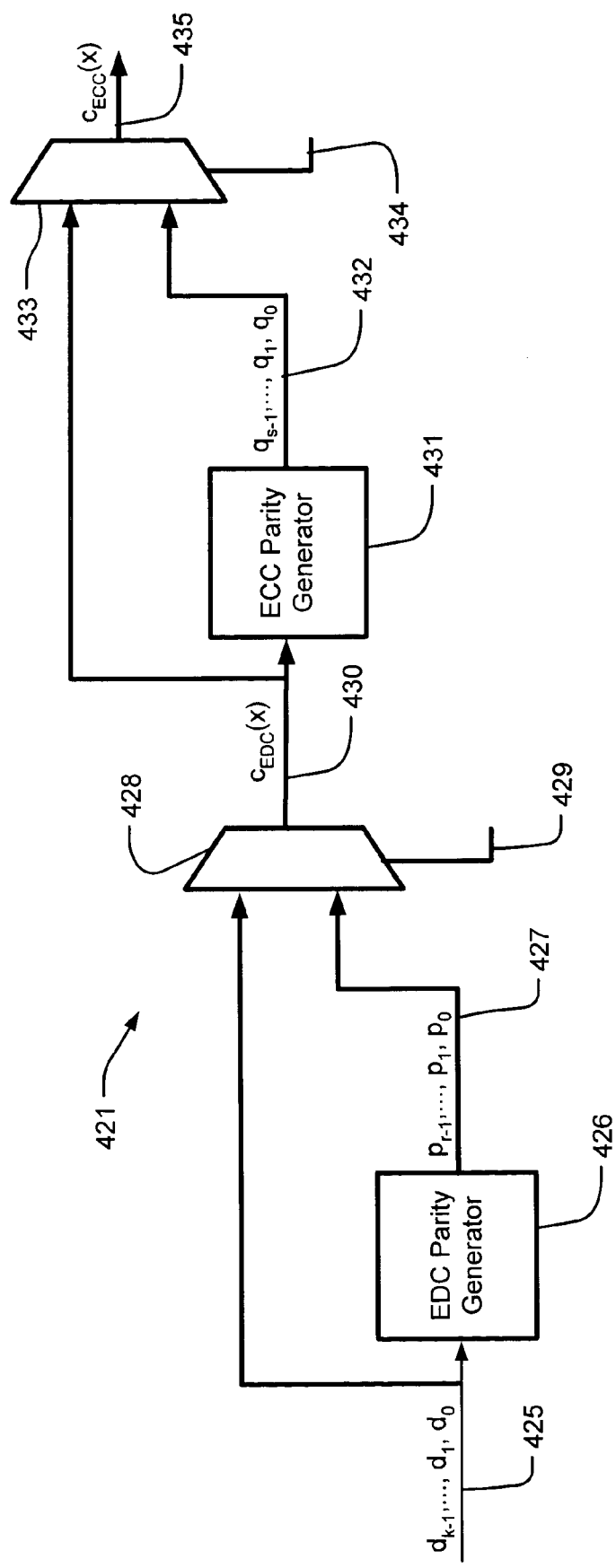
FIG. 14 is an exemplary circuit for a concatenated encoding system in accordance with an embodiment of the present invention.

FIG. 14 illustrates a circuit 421 for the concatenated encoding system. The user data to be encoded 425 are partitioned into k data h-bit symbols $d_{k-1}$, $d_{k-2}$, ..., $d_1$, $d_0$. The user data 425 are the inputs to an EDC parity generator 426, which reads one symbol per clock cycle starting with $d_{k-1}$ and ending with $d_0$. The outputs 427 of the parity generator 426 are r h-bit EDC parity symbols $p_{r-1}$, $p_{r-2}$, ..., $p_1$, $p_0$. After $d_0$ has been read, the parity symbols 427 are transferred from the EDC parity generator 426 one symbol per clock starting with $p_{r-1}$ and ending with $p_0$. The data symbols 425 and the EDC parity symbols 427 are the inputs to a multiplexor 428. The multiplexor is controlled by a signal 429, so that the outputs 430 of the multiplexor are data symbols during the first k clock cycles of the transfer and are EDC parity symbols during the next r clock cycles. The outputs 430 constitute an EDC codeword and are the inputs to the ECC parity generator 431. The inputs $d_{k-1}$, $d_{k-2}$, ..., $d_1$, $d_0$, $p_{r-1}$, $p_{r-2}$, ..., $p_1$, $p_0$ are read by the ECC parity generator 431 one symbol per clock cycle starting with $d_{k-1}$ and ending with $p_0$. After $p_0$ has been read, the parity symbols 432 are transferred from the ECC parity generator 431 one symbol per clock starting with $q_{s-1}$ and ending with $q_0$. The EDC codeword symbols 430 and the ECC parity symbols 432 are the inputs to a multiplexer 433. The multiplexer is controlled by a signal 434, so that the outputs 435 of the multiplexor are EDC codeword symbols during the first r+k clock cycles of the transfer and are ECC parity symbols during the next s clock cycles. The outputs 435 constitute an ECC codeword and are the outputs of the encoder block.

The EDC parity symbols $p_i$ are chosen so that the polynomial value $c_{EDC}(\alpha) = 0$, for all a in a certain subset A. The subset A typically has r elements in a Galois field. The ECC parity symbols $q_j$ are chosen so that the polynomial value $c_{ECC}(b) = 0$, for all b in a certain subset B. The subset B typically has s elements in a Galois field. The symbols $p_i$ and $q_j$ may be generated in any manner consistent with the error detection/correction algorithm being used in a particular implementation. The particular manner in which the symbols $p_i$ and $q_j$ are calculated is not particularly relevant to an embodiment of the present invention.

Figure 15:
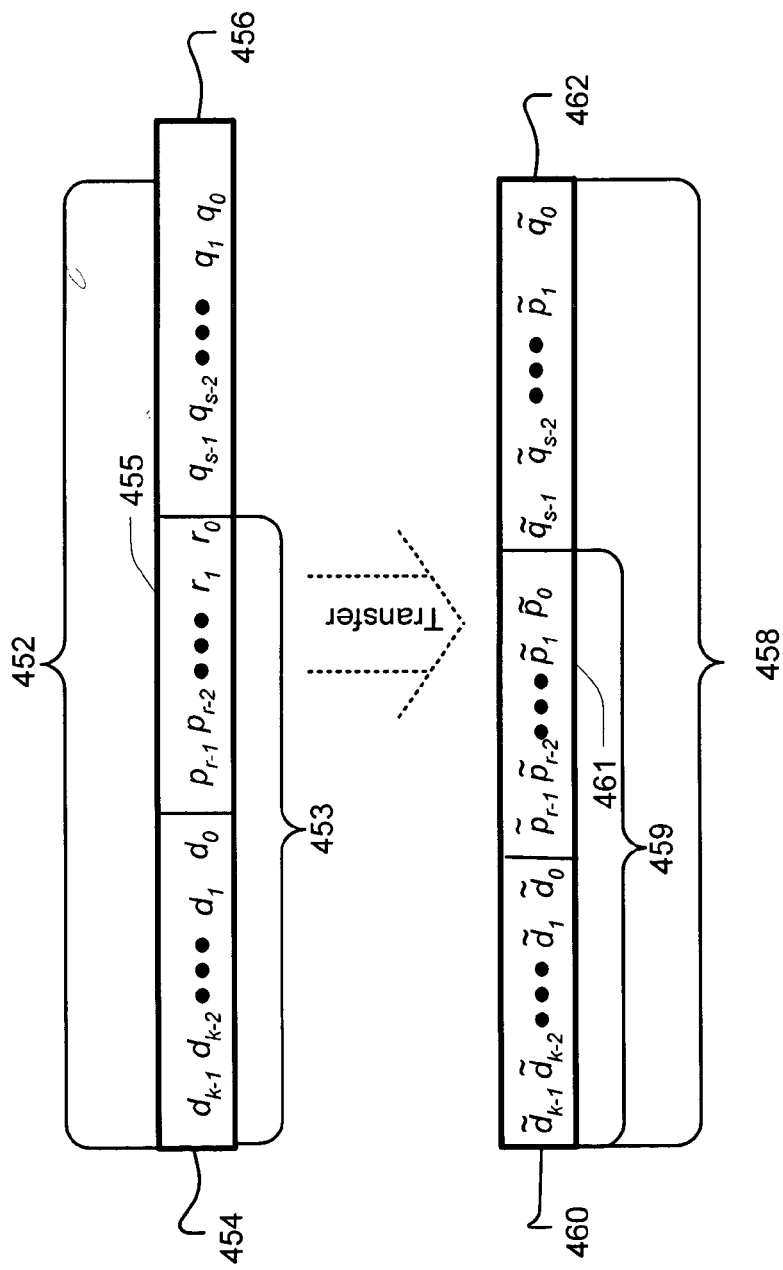
FIG. 15 illustrates exemplary code words that may be transferred and analyzed for errors in an embodiment of the present invention.

FIG. 15 illustrates the case where the data, EDC parity, and ECC parity symbols are transferred to the medium (e.g., storage medium or communication medium), in the form of an original ECC codeword 452. The original ECC codeword 452 is made up of three portions. The first portion 454 consists of user data. The user data are the series of data symbols, $d_{k-1}$, $d_{k-2}$, and so on. The second portion 455 includes EDC parity symbols $p_{r-1}$, $p_{r-2}$, and so on. The third portion 456 includes ECC parity symbols $q_{s-1}$, $q_{s-2}$, and so on. The original EDC codeword 453 is made up of user data 454 and EDC parity 455.

The original ECC codeword 452 is transferred to a storage medium, such as a magnetic disc. The original ECC codeword 452 is later retrieved from the medium and decoded to detect any errors. After the original ECC codeword 452 is retrieved, it is represented as a retrieved ECC codeword 458. The retrieved ECC codeword 458 may differ from the original codeword 452 because read errors or other errors may arise. The retrieved codeword 458 is made up of retrieved user data 460, retrieved EDC parity data 461, and retrieved ECC parity data 462. Similarly, the retrieved EDC codeword 459 is made up of retrieved user data 460 and retrieved EDC parity 461. The retrieved user data 460 include retrieved user symbols, $\tilde{d}_{k-1}$, $\tilde{d}_{k-2}$, and so on. The retrieved EDC parity data 461 include retrieved parity symbols $\tilde{p}_{r-1}$, $\tilde{p}_{r-2}$, and so on. The retrieved ECC parity data 462 include retrieved parity symbols $\tilde{q}_{s-1}$, $\tilde{q}_{s-2}$, and so on. The retrieved EDC parity data 461 and retrieved ECC parity data 462 are used to detect errors in symbols of the retrieved ECC codeword 458.

Figure 16:
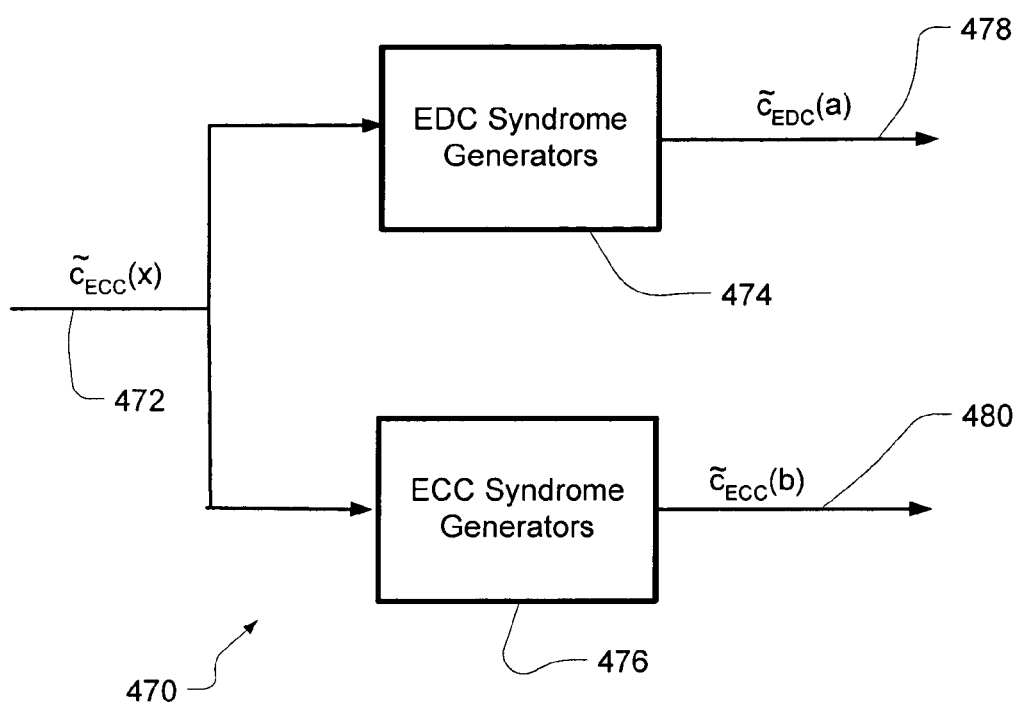
FIG. 16 is an exemplary circuit for computing polynomial values of $\tilde{c}_{EDC}(x)$ and $\tilde{c}_{ECC}(x)$ in accordance with an embodiment of the present invention.

FIG. 16 illustrates a circuit 470 for computing the polynomial values $\tilde{c}_{EDC}(\alpha)$ and $\tilde{c}_{ECC}(b)$, as a ranges over the set A and b ranges over the set B. The symbols in the retrieved codeword $\tilde{c}_{ECC}(x)$ are the inputs 472 to a bank of EDC syndrome generators 474 and to a bank of ECC syndrome generators 476. The outputs 478 of the EDC syndrome generators 474 are the values $\tilde{c}_{EDC}(\alpha)$ as a ranges over the set A. The outputs 480 of the ECC syndrome generator 476 are the values $\tilde{c}_{ECC}(b)$ as b ranges over the set B. The set of EDC syndrome generators 474 typically consists of r syndrome generators of the type described in FIG. 7. The block 476 typically consists of s syndrome generators of the type described in FIG. 7, where the multiplier block 704 now implements multiplication by b. The computation of the EDC syndromes 478 is complete after the EDC syndrome generator 474 has read the symbol $\tilde{p}_0$. Thus, the computation of the EDC syndromes 478 takes r+k clock cycles and the s symbols $\tilde{q}_j$ are ignored for the purpose of EDC syndrome computation. Similarly, the computation of the ECC syndromes 480 is complete after the ECC syndrome generator 476 has read the symbol $\tilde{q}_0$, so that the computation of the ECC syndromes 480 takes r+s+k clock cycles.

Figure 5:
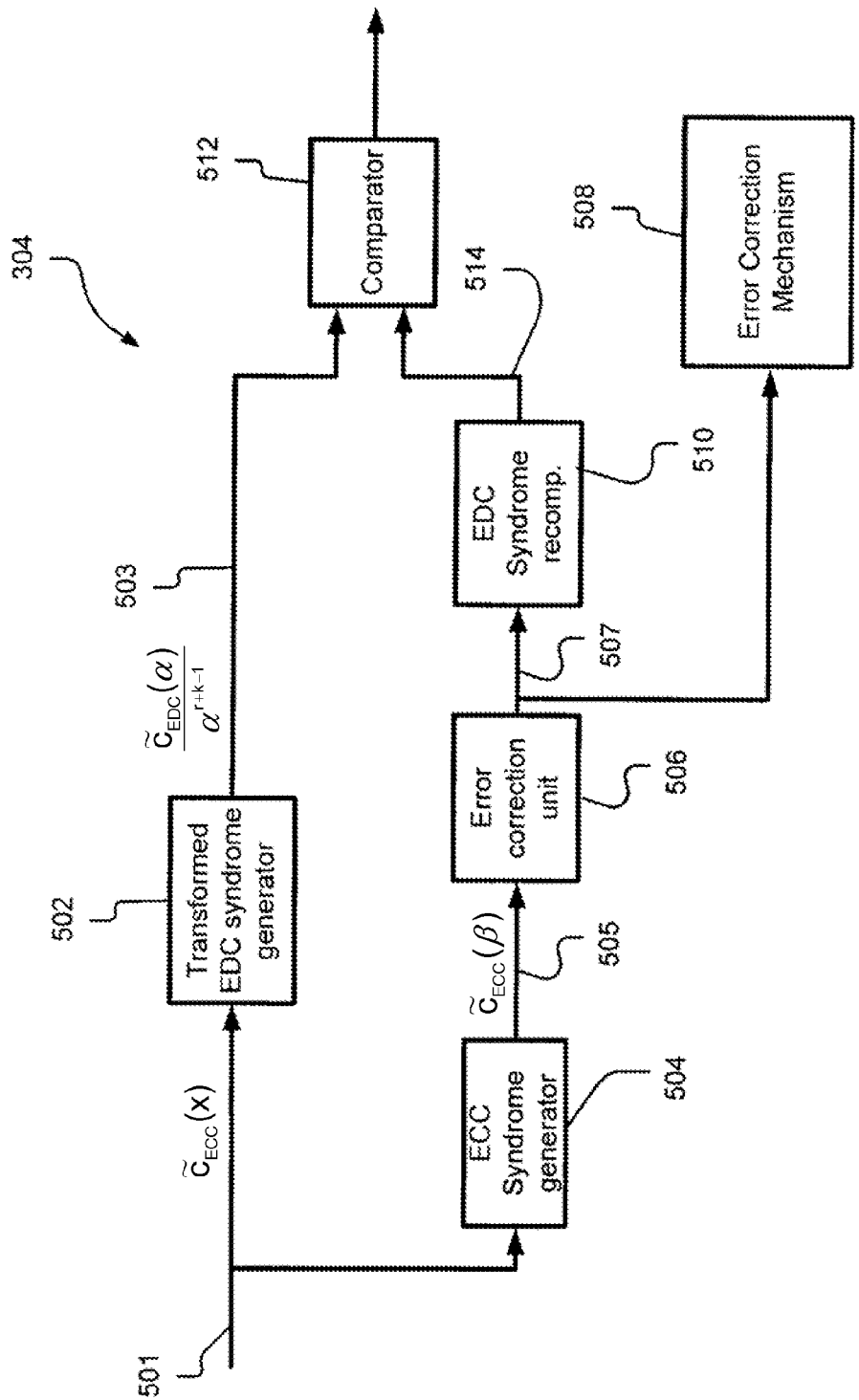
FIG. 5 is a module diagram illustrating primary functional modules of a decoder of FIG. 3 in accordance with an embodiment of the present invention.

FIG. 5 is a module diagram illustrating primary functional modules of a decoder 304 shown in FIG. 3 in accordance with an embodiment of the present invention. Both a transformed EDC syndrome generator 502 and an ECC syndrome generator 504 receive retrieved data $\tilde{c}_{ECC}(x)$ 501 as in FIG. 16. As before, the EDC syndromes are the values $\tilde{c}_{EDC}(\alpha)$ as $\alpha$ ranges over the set A. The transformed EDC syndromes are the values 503

$$\frac{\tilde{c}_{EDC}(\alpha)}{\alpha^{r+k-1}}$$

as $\alpha$ ranges over the set A, where r is the number of EDC parity symbols and k is the number of data symbols. Each transformed EDC syndrome is zero if and only if the corresponding EDC syndrome is zero. The transformed EDC syndrome generator 502 first computes the EDC syndromes $\tilde{c}_{EDC}(\alpha)$, then divides the syndromes by $\alpha^{r+k-1}$ and outputs the values 503. Details of a particular embodiment of the transformed EDC syndrome generator 502 are discussed in further detail below. As in FIG. 16, the ECC syndrome generator 504 computes ECC syndromes 505 $\tilde{c}_{ECC}(\beta)$ as $\beta$ ranges over the set B.

The ECC syndromes 505 are the inputs to an error correction unit 506, which computes error locations and error values 507 using algorithms well-known to those skilled in the art. Typically, the error correction unit 506 first computes an error locator polynomial $\Lambda(x)$ and an error evaluator polynomial $\Omega(x)$ by applying a key equation solver such as the Berlekamp-Massey algorithm. Both of these polynomials have coefficients in the Galois field $GF(2^h)$. Next a Chien search systematically checks each location in the received codeword to determine if an error has occurred in that location. The locations in the codeword correspond to a Galois field elements in such a way that a location with an error corresponds to a root of the equation $\Lambda(x)=0$. Thus, the Chien search finds error locations through an exhaustive search for the roots of the error locator polynomial. In one embodiment, the Chien search begins with the location occupied by the last ECC parity symbol $q_0$ and ends with the location occupied by the first data symbol $d_{k-1}$. In this way, the retrieved data and parity symbols are checked for errors, one symbol per clock cycle, in the following order: $\tilde{q}_0, \ldots, \tilde{q}_{s-1}, \tilde{p}_0, \ldots, \tilde{p}_{r-1}, \tilde{d}_0, \ldots, \tilde{d}_{k-1}$. If an error is found in the symbol $\tilde{d}_n$, then the error value $e_n$ is determined by the equation $\tilde{d}_n = d_n + e_n$. Typically, the error value is computed from the error location, the error locator polynomial, and the error evaluator polynomial by applying Forney's algorithm. The particular manner in which the error locations and the error values are calculated is not particularly relevant to an embodiment of the present invention. Those skilled in the art are referred to "Error-Correction Coding for Digital Communications," by Clark and Cain, for a more detailed discussion of error correction algorithms.

The error locations and error values 507 computed by the error correction unit 506 are sent to an error correction mechanism 508 that performs corrections on the retrieved user data. Typically, the user data have been stored in a buffer and for each correction computed by the error correction unit 506, the correction mechanism 508 will read the corrupted data symbol, perform the correction in the data, then write the corrected data back to the buffer. The details are not relevant to the present invention, as the purpose of the present invention is to validate, rather than calculate, an error correction.

The error locations and error values 507 are also sent to an EDC syndrome recomputation block 510, which recomputes the transformed EDC syndromes 511 from the error locations and values using Horner's algorithm in a manner to be described in more detail later. Finally, the transformed EDC syndromes 503 computed by the block 502 and the transformed EDC syndromes 511 computed by the recomputation block 510 are sent to a comparator 512 for comparison. If the two sets of syndromes are not equal, then a miscorrection has been detected. The comparator 512 preferably outputs a binary value, depending on the difference between the transformed EDC syndromes 503 and the transformed EDC syndromes 511. The comparator 512 is preferably implemented with combinational logic, such as computing the bitwise XOR of the two sets of syndromes and verifying the resulting bits are all zero. However, the comparator 512 may also be implemented in any combination of hardware, firmware, or software as suited to the particular implementation. In particular, the comparator 512 may include a tolerance value whereby if the transformed EDC syndromes 503 and the transformed EDC syndromes 511 differ only slightly (e.g. only by the tolerance value), the comparator 512 will nonetheless consider the values equal.

Figure 6:
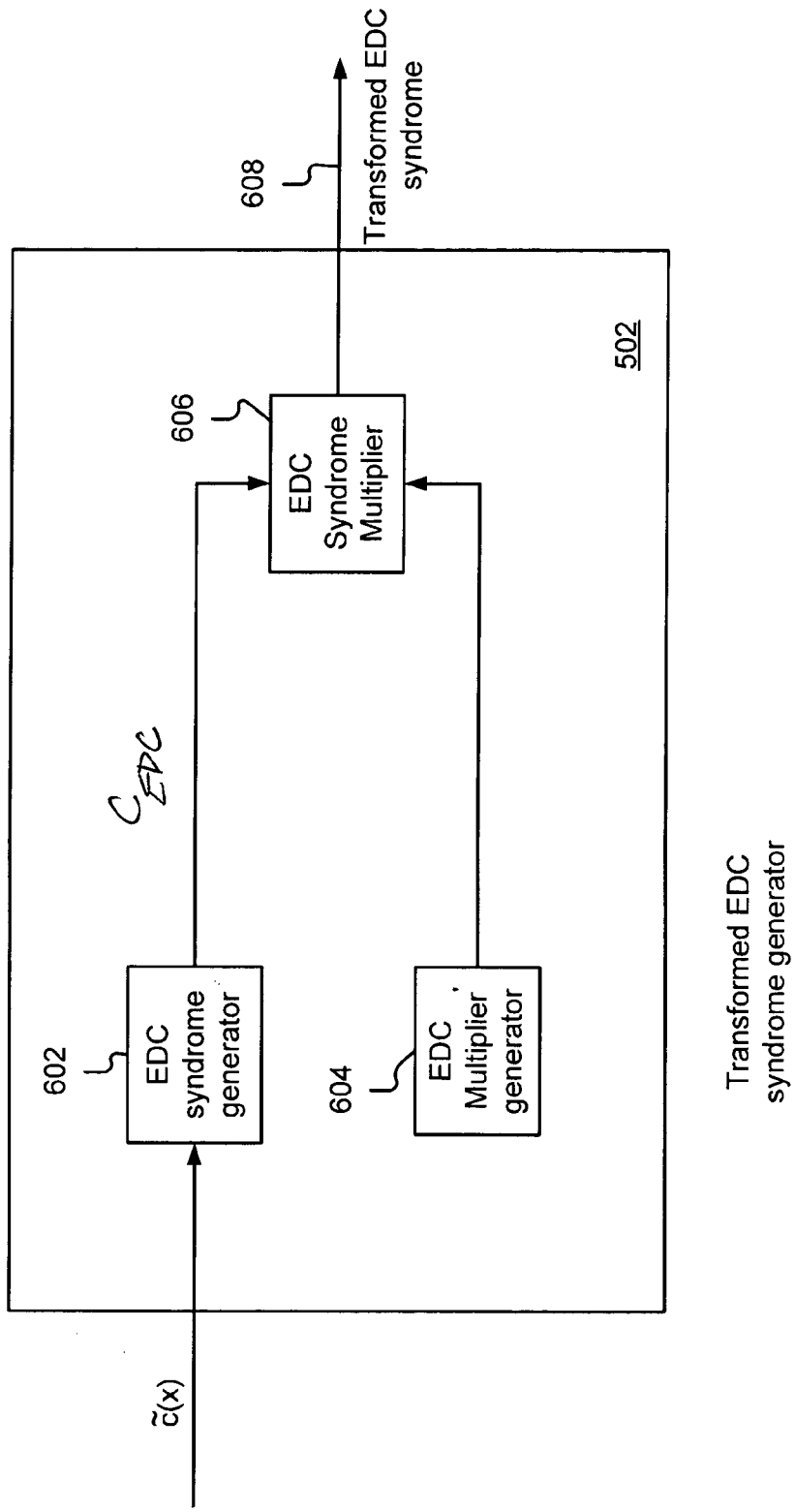
FIG. 6 illustrates one embodiment of a transformed error detection code (EDC) syndrome generator in accordance with the present invention.

FIG. 6 illustrates one exemplary embodiment of a transformed error detection code (EDC) syndrome generator 502. The transformed EDC syndrome generator 502 includes a non-transformed EDC syndrome generator 602, an EDC multiplier generator 604 and an EDC syndrome multiplier 606. The EDC syndrome generator 602 calculates syndrome values associated with retrieved data $\tilde{c}_{EDC}(x)$. As in FIG. 16, the EDC syndrome generator 602 calculates syndrome values $\tilde{c}_{EDC}(\alpha)$, as $\alpha$ ranges over the fixed set A. If any of the syndromes calculated by the EDC syndrome generator 602 are non-zero, an error has occurred in the retrieved EDC codeword $\tilde{c}_{EDC}(x)$, and, hence, in the retrieved ECC codeword $\tilde{c}_{ECC}(x)$. When the EDC syndrome generator 602 calculates syndrome values, the EDC multiplier generator 604 generates multiplier values in parallel.

The outputs of the EDC multiplier generator 604 are powers $\alpha^{-(r+k-1)}$ as $\alpha$ ranges over the fixed set A. Both the outputs $c_{EDC}(\alpha)$ of the EDC syndrome generator 602 and the outputs $\alpha^{-(r+k-1)}$ of the EDC multiplier generator 604 are communicated to the EDC syndrome multiplier 606. The EDC syndrome multiplier 606 multiplies the EDC syndromes with the EDC multipliers to yield the transformed EDC syndromes $$\frac{\tilde{c}_{EDC}(\alpha)}{\alpha^{r+k-1}}.$$

The transformed EDC syndrome may be used as an indicator of errors in the retrieved data $\tilde{c}_{ECC}(x)$ or in a corrected version of $\tilde{c}_{ECC}(x)$. During operation, the transformed EDC syndrome values are preferably stored in memory so that they can be used later to identify miscorrections, if any.

Figure 8:
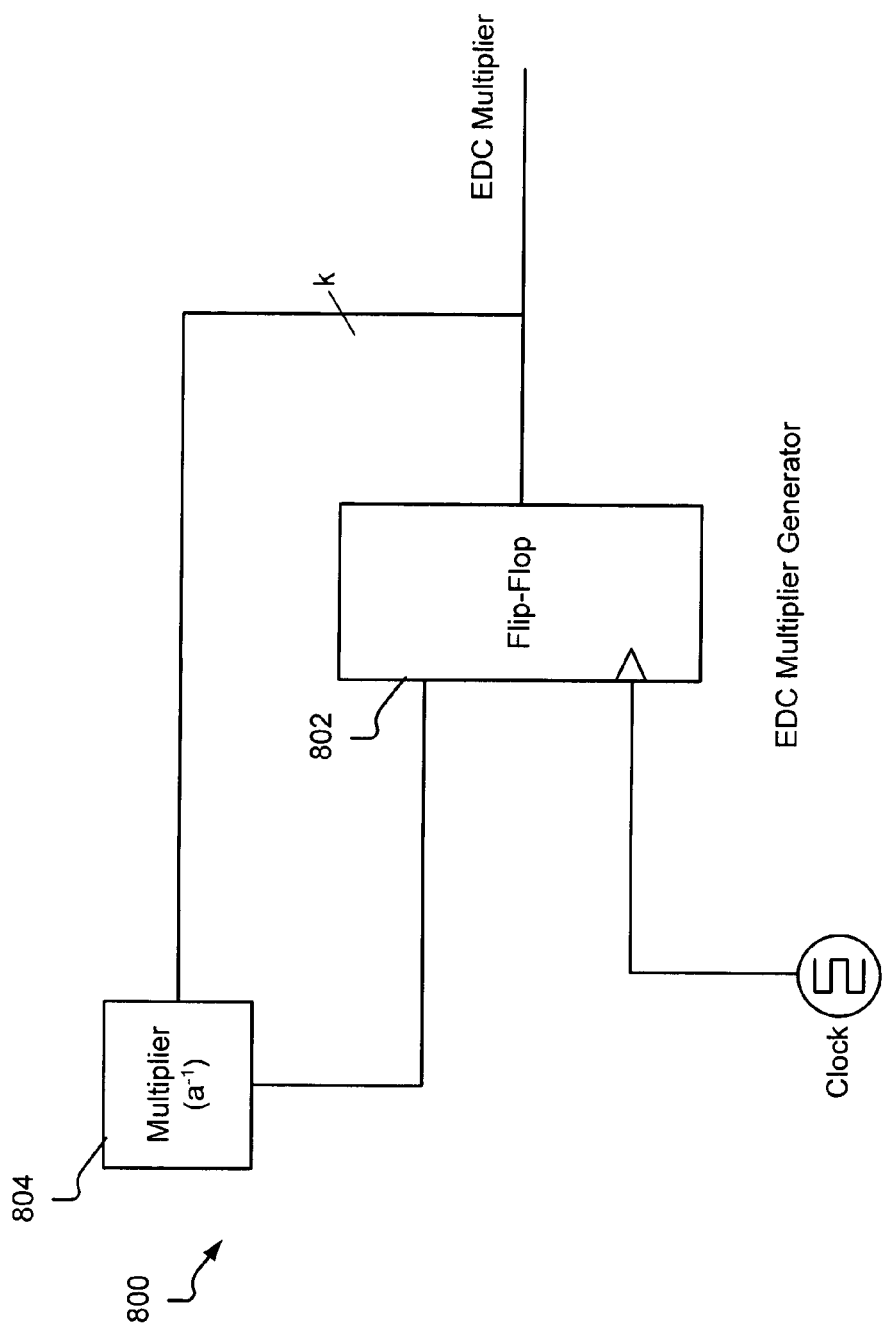
FIG. 8 illustrates a circuit diagram in accordance with an embodiment of the EDC multiplier generator of FIG. 6.

FIG. 8 illustrates a circuit diagram in accordance with an embodiment of the EDC multiplier generator 604 of FIG. 6. The circuit 800 includes a bank of flip-flops 802 and a multiplier 804 coupled together in a feedback relationship. The bits in the flip-flops 802 are initialized to a value corresponding to the element 1 in the Galois field $GF(2^h)$. The bits in the flip-flops 802 are clocked out of the flip-flops 802 and input to the multiplier 804. The multiplier 804 multiplies the input by a fixed value $\alpha^{-1}$. The output of the multiplier 804 is clocked into the flip-flop 802. After one clock cycle, the value in the flip-flops 802 equals $1 \cdot \alpha^{-1} = \alpha^{-1}$. After two clock cycles, the value equals $\alpha^{-1} \cdot \alpha^{-1} = \alpha^{-2}$. After three clock cycles, the value equals $\alpha^{-2} \cdot \alpha^{-1} = \alpha^{-3}$, etc. Finally, after r+k−1 clock cycles, the value in the flip-flops 802 equals $\alpha^{-(r+k-1)}$.

Now referring back to FIG. 5, the value of an EDC syndrome is $\tilde{c}_{EDC}(\alpha) = \tilde{d}_{r-1}\alpha^{r+k-1} + \ldots + \tilde{d}_0\alpha^r + \tilde{p}_{r-1}\alpha^{r-1} + \ldots + \tilde{p}_0$, so that the value of the corresponding transformed EDC syndrome is $$\frac{\tilde{c}_{EDC}(\alpha)}{\alpha^{r+k-1}}.$$

To simplify the notation, $c_{EDC}(x)$ will be written as $c(x)$, where $c(x) = c_{r+k-1}x^{r+k-1} + \ldots + c_1 x + c_0$, so that $c_i = p_i$, for i=0, 1, ..., r−1 and $c_i = d_{i-r}$, for ii=r, r+1, ..., r+k−1. Similarly, $\tilde{c}_{EDC}(x)$ will be written as $\tilde{c}(x)$, where $\tilde{c}(x) = \tilde{c}_{r+k-1}x^{r+k-1} + \ldots + \tilde{c}_1 x + \tilde{c}_0$, so that $\tilde{c}_i = \tilde{p}_i$, for i=0, 1, ..., r−1 and $\tilde{c}_i = \tilde{d}_{i-r}$, for i=r, r+1, ..., r+k−1. With this new notation, the EDC syndrome is $\tilde{c}(\alpha) = \tilde{c}_{r+k-1}a^{r+k-1} + \ldots + \tilde{c}_1\alpha + \tilde{c}_0$ and the transformed EDC syndrome is $$\frac{\tilde{c}(\alpha)}{\alpha^{r+k-1}} = \tilde{c}_0(a^{-1})^{r+k-1} + \tilde{c}_1(a^{-1})^{r+k-2} + \ldots + \tilde{c}_{r+k-2}(a^{-1}) + \tilde{c}_{r+k-1}.$$

In effect, the transformed EDC syndrome is $\tilde{c}_{rev}(\alpha^{-1})$, where $\tilde{c}_{rev}(x)$ is $\tilde{c}(x)$ with the order of its coefficients reversed $\tilde{c}_{rev}(x) = \tilde{c}_0 x^{r+k-1} + \tilde{c}_1 x^{r+k-2} + \ldots + \tilde{c}_{r+k-2} x + \tilde{c}_{r+k-1}$. The error in symbol i, computed by the error correction unit 506, will be denoted $e_i$, so that $c_i + e_i = \tilde{c}_i$. Then if $e(x) = e_{r+k-1}x^{r+k-1} + e_{r+k-2}x^{r+k-2} + \ldots + e_1 x + e_0$, then $\tilde{c}(x) = c(x) + e(x)$ and $\tilde{c}_{rev}(x) = c_{rev}(x) + e_{rev}(x)$, where $e_{rev}(x) = e_0 x^{r+k-1} + e_1 x^{r+k-2} + \ldots + e_{r+k-2} x + e_{r+k-1}$. Therefore, the transformed EDC syndrome is $\tilde{c}_{rev}(\alpha^{-1}) = \tilde{c}_{rev}(\alpha^{-1}) + e_{rev}(\alpha^{-1}) = 0 + e_{rev}(\alpha^{-1}) = e_{rev}(\alpha^{-1})$. The EDC syndrome recomputation block 510 will recompute the transformed EDC syndrome by evaluating the polynomial $e_{rev}(x)$ at $x = a^{-1}$ by Horner's algorithm, using the error values determined by the error correction unit 506.

Figure 9:
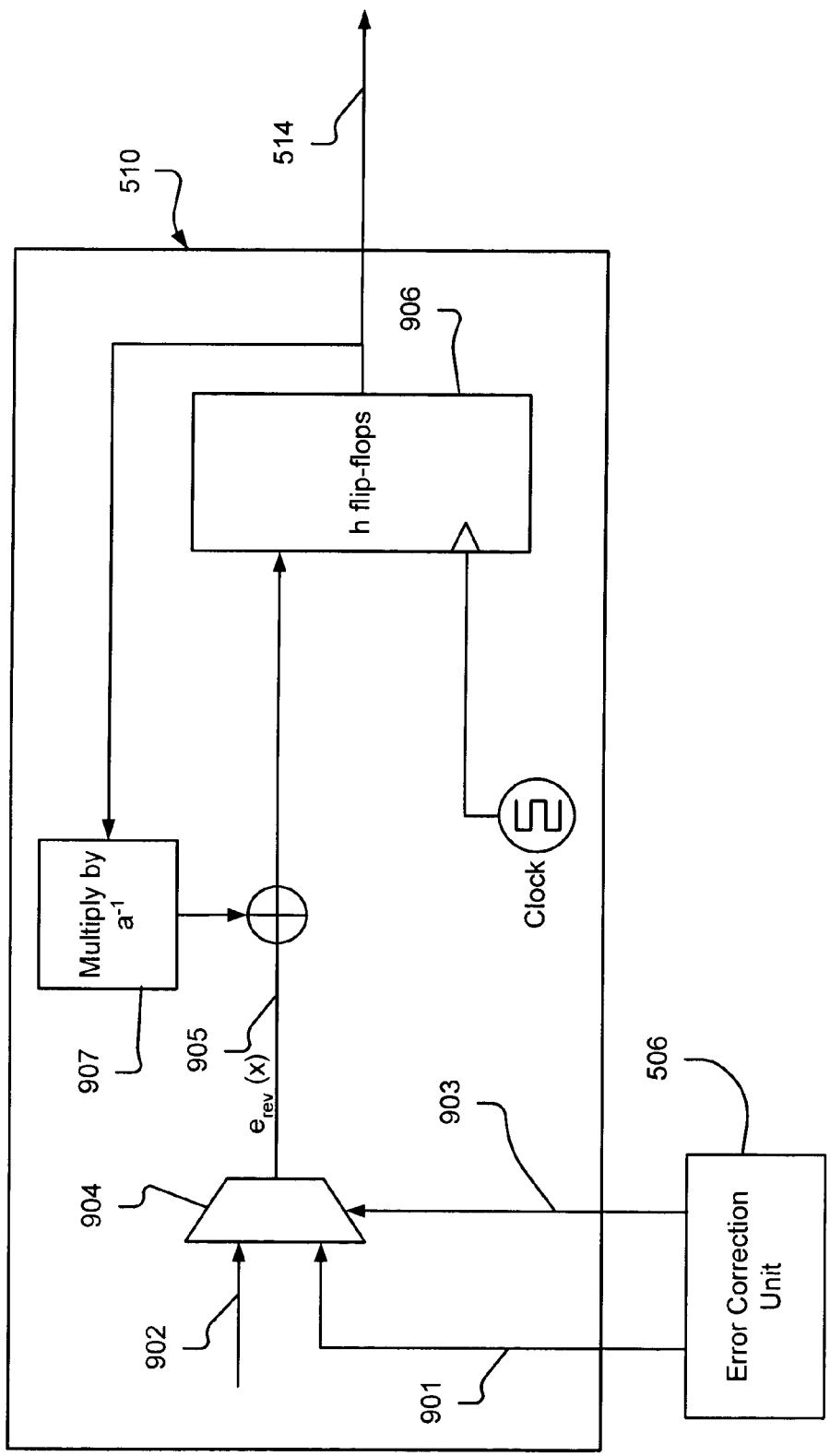
FIG. 9 illustrates a circuit diagram in accordance with an embodiment of the error locator and transformed error generator of FIG. 5.

FIG. 9 illustrates a circuit implementing the EDC re-computation block 510 shown in FIG. 5. The part of the circuit containing the bank of flip-flops 906 and the block 907 implementing multiplication by $a^{-1}$ implements Horner's algorithm and functions like the circuit depicted in FIG. 7. The inputs 905 are the coefficients of the reversed error polynomial $e_{rev}(x)$, which are transferred one symbol per clock cycle in the following order: $e_0, e_1, \ldots, e_{r+k-2}, e_{r+k-1}$. The flip-flops 906 are initialized to zero and after the transfer of $e_0$ take on the value $0 \cdot \alpha^1 + e_0 = e_0$. During the next cycle, $e_1$ is transferred along input line 905 and the value in the flip-flops 906 becomes $e_0 \cdot \alpha^{-1} + e_1$. During the next cycle, $e_2$ is transferred along input line 905 and the value in the flip-flops 906 becomes $(e_0 \cdot \alpha^{-1} + e_1) \cdot \alpha^{-1} + e_2 = e_0 \cdot (\alpha^{-1})^2 + e_1 \cdot \alpha^{-1} + e_2$. After the final coefficient $e_{r+k-1}$ has been transferred, the value in the flip-flops 906 is $e_0(\alpha^{-1})^{r+k-1} + e_1(\alpha^{-1})^{r+k-2} + \ldots + e_{r+k-2}\alpha^{-1} + e_{r+k-1} = e_{rev}(\alpha^{-1})$, which is the transformed EDC syndrome.

The error values $e_i$ are the outputs of a multiplexor 904 which has two inputs: an error value 901 computed by the error correction unit 506 and an input 902 which is always zero. When the error correction unit 506 determines that there is an error in the $i^{th}$ symbol $\tilde{c}_i$, the corresponding error value $e_i$ is transmitted on 901. In addition, the control signal 903 causes the value 901 to be output by the multiplexor 904 as its output 905. When the error correction unit 506 determines that there is not an error in the $i^{th}$ symbol $\tilde{c}_i$, the value $e_i$ is zero and the control signal 903 causes the zero value 902 to be output by the multiplexor 904 as its output on line 905. In this case, it does not matter what the value 901 is.

Figure 10:
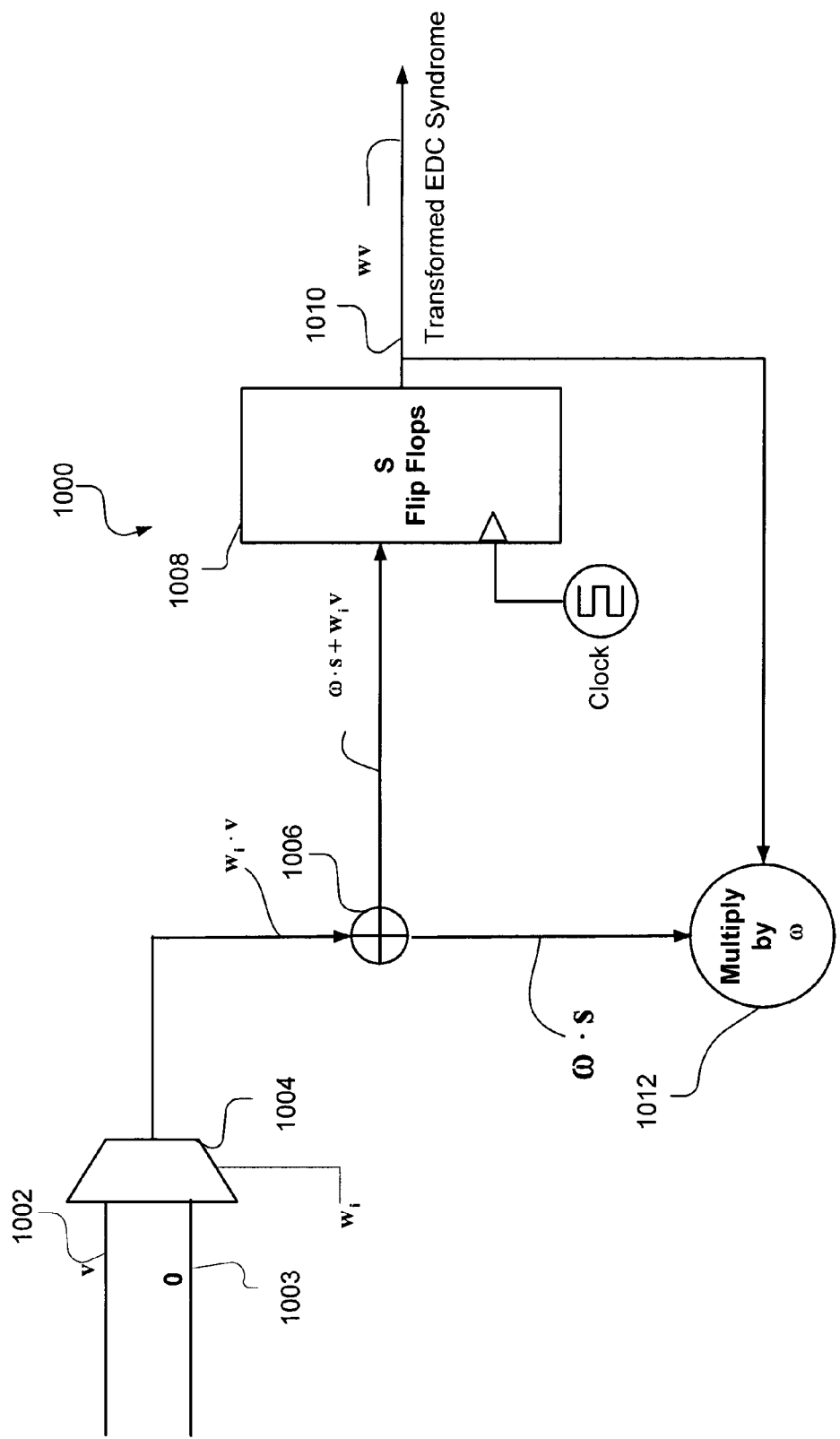
FIG. 10 illustrates a circuit diagram of an EDC syndrome computer in accordance with an alternative embodiment of the present invention.

FIG. 10 illustrates a circuit diagram in accordance with an alternative embodiment of the EDC Syndrome multiplier 606 in FIG. 6 in accordance with the present invention. Recall that the multiplier 606 computes the product of a EDC syndrome $\tilde{c}_{EDC}(\alpha)$ with a power $\alpha^{-(r+k-1)}$ to produce the transformed EDC syndrome $$\frac{\tilde{c}_{EDC}(\alpha)}{\alpha^{r+k-1}}.$$

Figure 11:
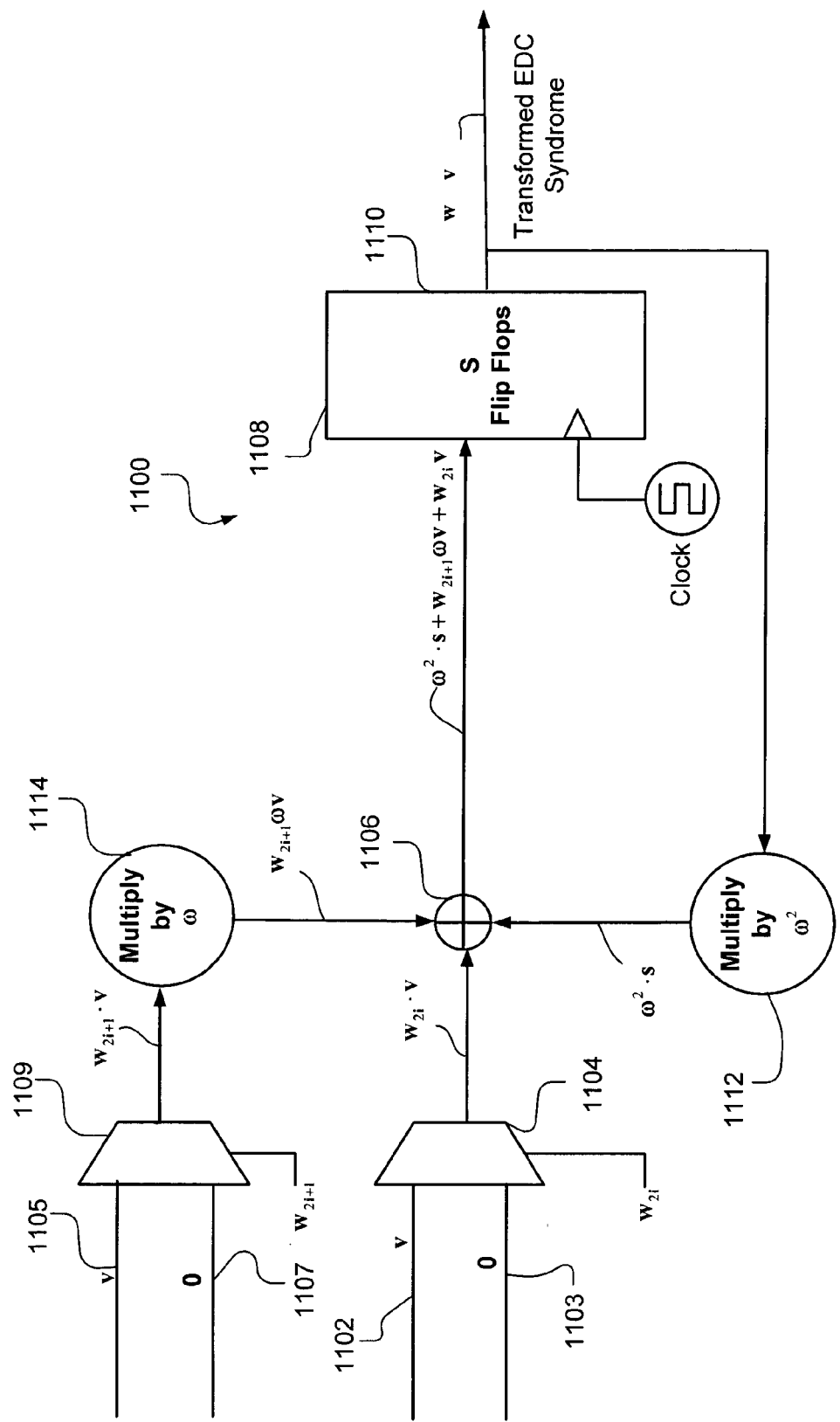
FIG. 11 illustrates a circuit diagram of an EDC syndrome computer in accordance with another embodiment of the present invention.

Since the two terms in the product are elements of the Galois field $GF(2^h)$, the block 606 is often referred to as a Galois field multiplier. Typically, a Galois field multiplier will compute a product in one clock cycle. However, the circuit complexity of a Galois field multiplier can be reduced if the product can be computed over several clock cycles. In this alternative, since the corrupted ECC parity symbols, in FIG. 6, are processed over a number of clock cycles and the transformed EDC syndromes are not used until the ECC parity symbols have been processed, there is more time to compute the product which yields the transformed EDC syndrome. Therefore more cost-effective hardware may be utilized. Two approaches are shown in FIG. 10 and FIG. 11.

One way to represent an element w of $GF(2^h)$ is as a polynomial $w_{h-1}\omega^{h-1} + \ldots + w_1\omega + w_0$, where $\omega$ is a root of a degree h polynomial $\phi(x)$, whose coefficients are in $GF(2)$ (i.e. each $w_i$ is either 0 or 1) and which is irreducible over $GF(2)$. Addition (resp. subtraction) is simply polynomial addition (resp. subtraction). In both cases, the operation amounts to bitwise XOR. Multiplication is polynomial multiplication followed by a reduction using the relationship $\phi(\omega) = 0$. After this reduction, the product is again a polynomial in $\omega$ of degree no greater than h−1.

Let v and w be elements of $GF(2^h)$, where $w = w_{h-1}\omega^{h-1} + \ldots + w_1\omega + w_0$. (Here v will be an EDC syndrome $\tilde{c}_{EDC}(\alpha)$ and w will be a power $\alpha^{-(r+k-1)}$ or vice versa.) The following method calculates the product wv over h clock cycles. In this case the method processes one of the h bits $w_i$ per clock cycle, starting with $w_{h-1}$ and ending with $w_0$.

Initially, S=0. In essence, each iteration replaces S by $\omega \cdot S + w_i \cdot v$.

Iteration 1:

$S=0$; process $w_{h-1}$ $S = \omega \cdot S + w_{h-1} \cdot v = \omega \cdot 0 + w_{h-1} = w_{h-1} \cdot v$ Iteration 2:

$S = w_{h-1} \cdot v$, process $w_{h-2}$ $S = \omega \cdot s + w_{h-2} \cdot v = \omega \cdot (w_{h-1} \cdot v) + w_{h-2} \cdot v = (w_{h-1} \cdot \omega + w_{h-2}) \cdot v$ Iteration 3:

$$S=(w_{h-1}\omega+w_{h-2})\cdot v, \text{ process } w_{h-3}$$

$$S=\alpha\cdot S+w_{-3}\cdot v=(w_{h-1}\omega^2+w_{h-2}\omega+w_{h-3})\cdot v$$

•
•
•

Iteration h:

$$S=(w_{h-2}\omega^{h-2}+w_{h-3}\omega^{h-3}+\ldots+w_2\omega+w_1)\cdot v \text{ and process } w_0^0.$$

$$S=(w_{h-1}\omega^{h-1}+w_{h-2}\omega^{h-2}+\ldots+w_1\omega+w_0)\cdot v=w\cdot v$$

The transformed EDC syndrome multiplier circuit 1000 that embodies the above is shown in FIG. 10. This embodiment essentially is a circuit 1000 that implements a Horner evaluation. In essence, this circuit performs similar functions to that of EDC syndrome multiplier 606 in FIG. 6, except wv is computed over h clock cycles. Multiplexor 1004 receives the h bits of the v input on line 1002 and a 0 input on line 1003. The output of the multiplexor 1004 is controlled by the value of the bit $w_i$. If $w_i$ is equal to 1, the output of the multiplexor 1004 is v. If $w_i$ is equal to 0, the output of the multiplexor 1004 is 0. Thus, the output of multiplexor 1004 is really $w_i\cdot v$. This output is fed to the adder 1006. The adder 1006 also receives an input from multiplier 1012 which is $\omega\cdot S$. Thus the output of the adder 1006 is $\omega\cdot S+w_i\cdot v$, which becomes the new value of S in the bank of h flip-flops 1008. The output S of the bank of flip flops 1008 is the input to the multiplier 1012, which in turn is multiplied by $\omega$ and fed to the adder 1006. After h clock cycles the summation output of the bank of flip-flops 1008 is $S=w\cdot v$. When w and v are chosen to be an EDC syndrome and a power of a (in some order) the output 1010 is the transformed EDC syndrome.

FIG. 11 illustrates a circuit diagram of another alternative embodiment of an EDC syndrome computer 1100 in accordance with the present invention that takes half the clock cycles to complete as does the alternative shown in FIG. 10. This embodiment essentially is a circuit 1100 that implements an accelerated Horner evaluation. Here, h is always even. Thus wv is computed over h/2 clock cycles and thus takes half the time to complete. The decreased computation time comes at the cost of more expensive hardware.

Initially, S=0. In essence, each iteration replaces S by $\omega^2\cdot S+(w_{2i+1}\omega+w_{2i})\cdot v$.

Iteration 1:

$$S=0; \text{ process } w_{h-1} \text{ and } w_{h-2}$$

$$S=\omega^2\cdot S+(w_{h-1}\omega+w_{h-2})\cdot v=(w_{h-1}\omega+w_{h-2})\cdot v$$

Iteration 2:

$$S=(w_{h-1}\omega+w_{h-2})\cdot v, \text{ process } w_{h-3} \text{ and } w_{h-4}$$

$$S=\omega^2\cdot S+(w_{h-3}\omega+w_{h-4})\cdot v=\omega^2\cdot (w_{h-1}\omega+w_{h-2})\cdot v+(w_{h-3}\omega+w_{h-4})\cdot v$$

$$S=(w_{h-1}\omega^3+w_{h-2}\omega^2+w_{h-3}\omega+w_{h-4})\cdot v$$

Iteration h/2:

$$S=(w_{h-1}\omega^{h-3}+w_{h-2}\omega^{h-4}+\ldots+w_3\omega+w_2)\cdot v, \text{ process } w_1 \text{ and } w_0$$

$$S=(w_{h-1}\omega^{h-1}+w_{h-2}\omega^{h-2}+\ldots+w_1\omega+w_0)\cdot v=w\cdot v$$

The EDC syndrome generator circuit 1100 receives the same inputs on two multiplexors 1109 and 1104. The output of the multiplexor 1109 is $w_{2i+1}\cdot v$, whereas the output of the multiplexor 1104 is $w_{2i}\cdot v$. The output of multiplexor 1109 is fed to a multiplier 1114 which multiplies the input by $\omega$ and provides $w_{2i+1}\omega\cdot v$ to the adder 1106. The output of multiplexor 1104, which is $w_{2i}\cdot v$, is also provided to the adder 1106. As in the embodiment just described above, the adder 1106 also receives a feedback of the value S from the bank of h flip flops 1108, except that the feedback value S is fed through a multiplier 1112 which multiplies by $\omega^2$. The output of the adder 1106 then is $\omega^2\cdot S+w_{2i+1}\omega\cdot v+w_{2i}\cdot v$, which subsequently becomes the value stored in the flip flops 1108. After h/2 clock cycles the value on the line 1110 is the transformed EDC syndrome $w\cdot v$.

Figure 12:
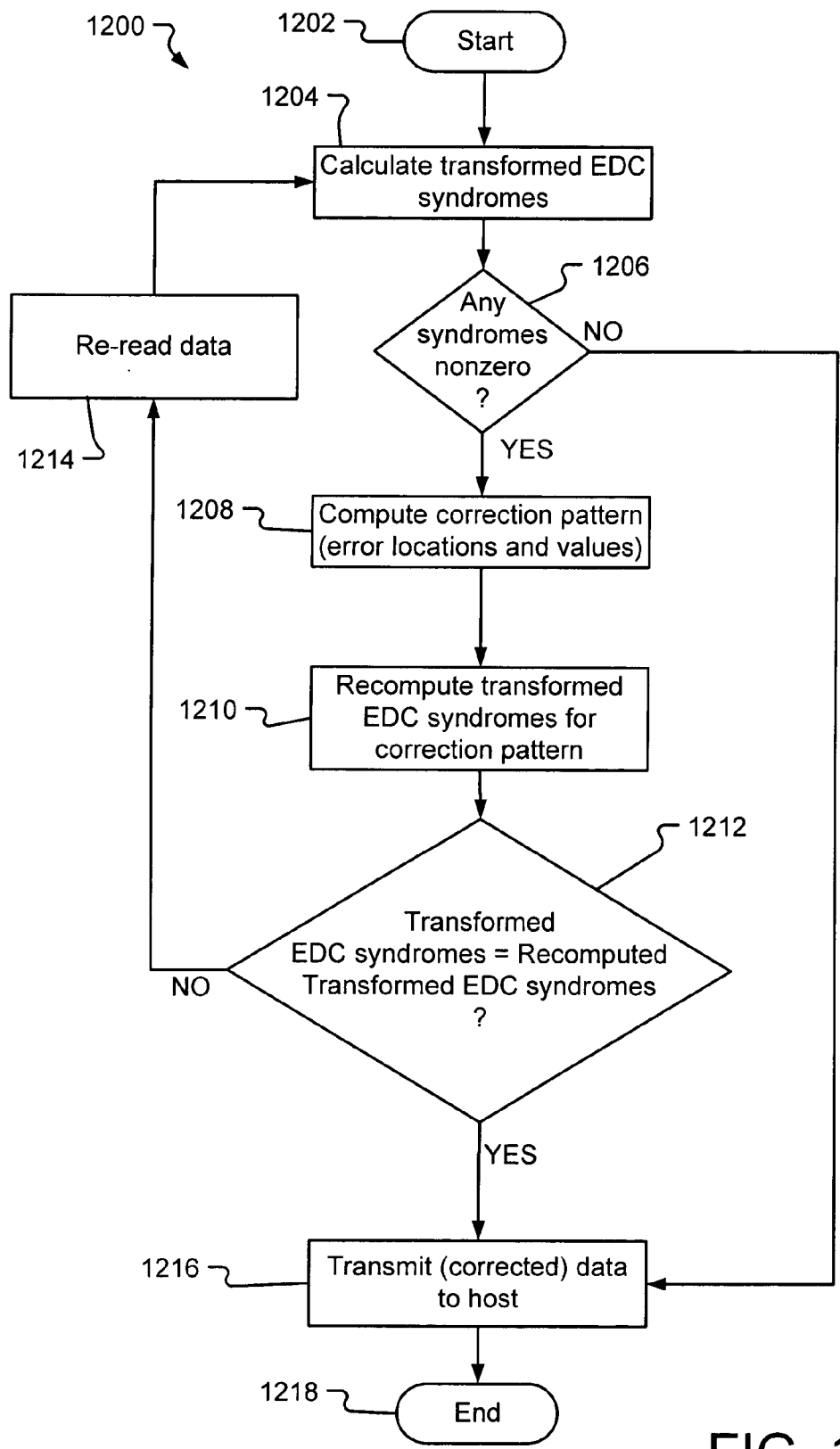
FIG. 12 is an operation flow diagram illustrating exemplary operations employed by an embodiment of an error detection system.

FIG. 12 illustrates an error detection operation 1200 having exemplary operations employed by an embodiment of an error detection system of the present invention. The embodiment illustrated in FIG. 12 is particularly suited for a disc drive; however, the operations illustrated may be easily adapted by one skilled in the art to any other data transfer system, including, but not limited to, a digital communication system. In the context of disc drive operation, the disc drive responds to commands from a host computer. Data may be read from the disc and transmitted to the host in response to the commands. Prior to transmitting the data to the host, the disc drive analyzes the data to determine if errors are present in the data. By way of example, but not limitation, the host may issue a read command to the disc drive. In response, the disc drive reads from a requested physical disc sector, and performs the error detection operation 1200.

In general, the error detection operation 1200 iteratively computes and compares transformed EDC syndromes to recomputed transformed EDC syndromes to determine whether data has been miscorrected. After a start operation 1202, a calculate operation 1204 calculates one or more transformed EDC syndrome values using a predetermined error detection algorithm. The error detection algorithm that is used is related to the algorithm used by the encoder to generate the error detection code. For example, if in one embodiment, the transformed EDC syndrome values are calculated by first calculating non-transformed EDC syndrome values and multiplying them by powers of values associated with the error detection algorithm, as discussed above. The transformed EDC syndrome values may be calculated as the data is read from the disc. The calculate operation 1204 may include various steps, such as a storing step, wherein transformed EDC syndromes are stored in memory for later comparison and analysis.

After the calculate operation 1204, a query operation 1206 determines if any of the previous calculated transformed EDC syndromes are non-zero. (In addition, ECC syndromes are examined. If these syndromes are also all zero, then it is know with greater certainty that no errors have occurred.) A non-zero transformed EDC syndrome value indicates an error the retrieved data. Thus, if any of the transformed EDC syndromes are determined to be non-zero, an error correction process is undertaken. If none of the transformed EDC syndromes are determined to be zero, the operation 1200 branches "NO" to a transmit operation 1214.

If the query operation 1206 determines that any of the transformed EDC syndrome values are non-zero, the error detection operation 1200 branches "YES" to a calculate operation 1208. The calculate operation calculates errors associated with the retrieved data and any corrected data. In one embodiment, the calculate operation 1208 creates a key equation solver to compute an error locator polynomial and an error evaluator polynomial. Those skilled in the art will be familiar with error locator polynomials and error evaluator polynomials. Using the error locator polynomial and the error evaluator polynomial, roots of these polynomials are determined. The roots of these polynomials indicate locations of errors, as well as values needed to correct the errors.

After the calculate operation 1208 a recomputation operation 1210 recomputes the transformed EDC syndromes from the computed correction pattern. As discussed herein, the recomputed transformed EDC syndromes are a function of the calculated error, wherein symbols of an error value are multiplied by powers of the primitive values associated with the error detection algorithm. If no miscorrections have occurred, the transformed error values should be substantially equal to the previously calculated transformed EDC syndromes (calculated in the calculate operation 1204). Thus, a query operation 1212 determines whether the transformed EDC syndromes equal the recomputed transformed EDC syndromes.

The query operation 1212 preferably obtains the previously calculated transformed EDC syndrome values from memory and compares them to the recomputed transformed EDC syndromes. In one embodiment, the query operation 1212 determines whether the difference between the transformed EDC syndrome value and the recomputed transformed EDC syndromes is less than a predetermined threshold.

If the query operation 1212 determines that the transformed EDC syndrome values are not substantially equal to the recomputed transformed EDC syndromes, the error detection operation 1200 branches "NO" to a re-reading operation 1214. The re-reading operation 1214 re-reads data from the disc. The re-reading operation 1214 may include a step of realigning the transducer head and the disc drive, or any other remedial action prior to reading the data. If the query operation 1212 determines that the transformed EDC syndromes are substantially equal to the recomputed transformed EDC syndromes, the error detection operation 1200 branches "YES" to the transmitting operation 1216. The transmitting operation 1216 transmits the data as it may have been corrected to the host. The error detection operation 1200 ends at end operation 1218.

The logical operations of the various embodiments of the present invention are implemented (1) as a sequence of computer implemented acts or program modules running on a computing system, such as the disc drive 100 (FIG. 1), and/or (2) as interconnected machine logic circuits or circuit modules within the computing system. The implementation is a matter of choice dependent on the performance requirements of the computing system implementing the invention. Accordingly, the logical operations making up the embodiments of the present invention described herein are referred to variously as operations, structural devices, acts or modules. It will be recognized by one skilled in the art that these operations, structural devices, acts and modules may be implemented in software, in firmware, in special purpose digital logic, and any combination thereof without deviating from the spirit and scope of the present invention as recited within the claims attached hereto.

It will be clear that the present invention is well adapted to attain the ends and advantages mentioned as well as those inherent therein. While a presently preferred embodiment has been described for purposes of this disclosure, various changes and modifications may be made which are well within the scope of the present invention.

For example, one embodiment employs an EDC defined over $GF(2^k)$ and an ECC defined over $GF(2^m)$, where k is not equal to m. In this embodiment, the simplest case is where k=2 m. when k=2 m, one EDC coding/decoding iteration is performed for every two ECC coding/decoding iterations.

In yet another embodiment, the ECC is an interleaved code, where the user data and EDC parity are divided into several sub-blocks, called interleaves, for the purpose of ECC encoding and error correction. With an interleaved code, error corrections are performed on an interleave by interleave basis. The computation of the EDC syndromes from the computed error values has a number of stages, one for each interleave. The specific implementation depends on the number of interleaves.

More particularly, these variations may include the following:

Different Representations of $GF(2^h)$

In the description of the invention set forth above, both the EDC and ECC work with symbols in $GF(2^h)$, i.e. h-bit blocks of data are "represented" as elements of a Galois field. This representation allows the definition of basic arithmetic operations on the h-bit blocks of data. Mathematically there are many different ways to represent h-bit blocks of data as elements of $GF(2^h)$. Typically the bit vector $(b_{h-1}, \ldots, b_0)$ is represented as the polynomial $b_{h-1}\omega^{h-1} + \ldots + b_0$, where $\omega$ satisfies a defining relationship $\phi(\omega)=0$ where $\phi(x)$ is an irreducible polynomial of degree h over $GF(2)$. Here different irreducible polynomials will give different representations of the Galois field (with different definitions of the arithmetic operations). For example, GF(16) can be defined using any one of the following 3 defining relationships: $\omega^4+\omega^3+\omega^2+\omega+1=0$, $\omega^4+\omega^3+1=0$, or $\omega^4+\omega+1=0$.

In a variation of the invention, the h-bit blocks of data can have one representation as elements of $GF(2^h)$ for the purposes of EDC coding and another representation for the purposes ECC coding. For example, one irreducible polynomial $\phi_{EDC}(x)$ of degree h could be used to define arithmetic for the purpose of EDC encoding and decoding and a different irreducible polynomial $\phi_{EDC}(x)$ could be used to define arithmetic for the purpose of ECC encoding and decoding. Other possible representations of $GF(2^h)$ include, but are not restricted to, a representation via a normal basis or a representation of $GF(2^h)$ as an extension field of $GF(2^d)$, where d is a proper divisor of h.

Different Symbol Sizes

Another variation of the invention uses h-bit symbols for the EDC and g-bit symbols for the ECC, i.e. the EDC works with elements of $GF(2^h)$ and the ECC works with elements of $GF(2^g)$, where $g \neq h$. The case where h=2g is a special example. Here it is assumed that g bits of data are clocked on each clock cycle, so that 2g bits of data are available every other clock cycle for the purposes of EDC encoding and decoding. If $d_{k-1}, d_{k-2}, d_{k-3}, d_{k-4}, \ldots, d_3, d_2, d_1, d_0$ are the g-bit user data symbols, then concatenated pairs of these symbols will form the 2g-bit symbols used for EDC coding. Thus, the symbols used for EDC coding will be $(d_{k-1} \& d_{k-2})$, $(d_{k-3} \& d_{k-4}), \ldots, (d_3 \& d_2), (d_1 \& d_0)$, where $(d_i \& d_j)$ denotes the 2g-bit symbol formed by concatenating $d_i$ and $d_j$. (It can be assumed the k, the number of g-bit data symbols, is even. If not, an additional g-bit symbol, all of whose bits are zero, can be taken as the first data symbol.) The r EDC parity symbols $p_{r-1}, p_{r-2}, \ldots, p_1, p_0$ consist of 2g bits and will each be written as two g-bit symbols $p_i=(P_{2i} \& P_{2i+1})$ when they are viewed as "user data" for the purposes of ECC encoding. Thus, the 2g-bit symbols in the EDC codeword can be broken down into n=k+2r g-bit symbols, which will be written as $x_{n-1}, x_{n-2}, \ldots, x_1, x_0$.

Figure 17:
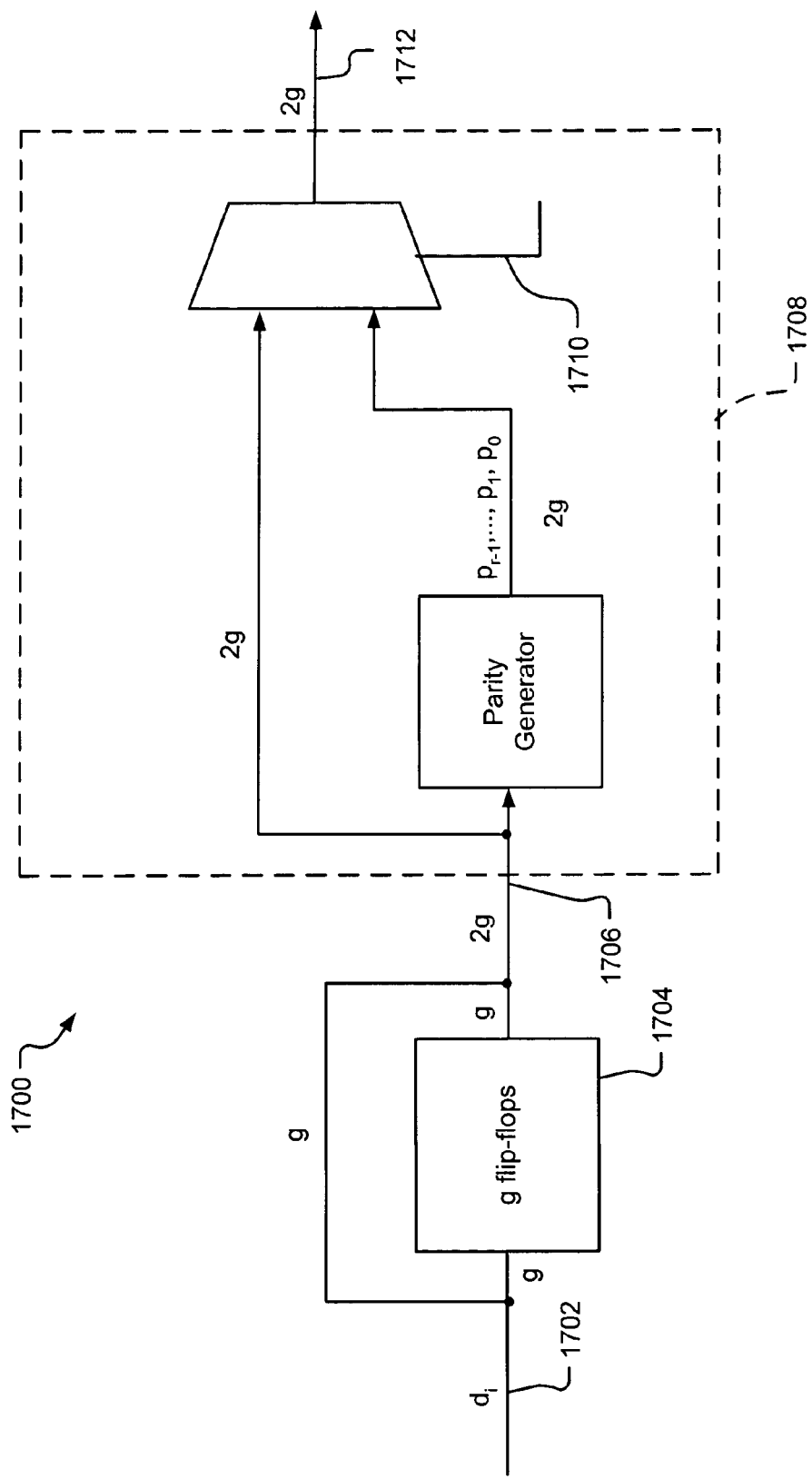
FIG. 17 is an exemplary EDC encoder circuit in which ECC and EDC symbol sizes differ by a factor of 2.

FIG. 17 illustrates an encoder circuit in this system: In this circuit 1700, g bits of user data on line 1702 are clocked in the flip-flops 1704 on every clock cycle. The 2g bits on output line 1706 consist of the g bits on line 1702 concatenated with the g bits stored in flip-flops 1704 on the previous clock cycle. The 2g bits on line 1706 from the flip-flops 1704 are then fed to the encoder 1708. The encoder block 1708 is an encoder as in FIG. 13. The control signal 1710 in the encoder 1708 causes the encoder 1708 to operate on every other clock cycle.

Thus, the encoder operates as follows:

1) On the first clock cycle, g bits of data $d_{k-1}$ are transferred on line 1702 and are clocked into the flip-flops 1704. The encoder 1708 is idle.

2) On the second clock cycle, g bits of data $d_{k-2}$ are transferred on line 1702 and are clocked into the flip-flops 1704. The 2g bits $d_{k-1}$ & $d_{k-2}$ (i.e. $d_{k-1}$ concatenated with $d_{k-2}$) are transferred on line 1706 to the encoder 1708, which performs an encoding iteration.

3) On the third clock cycle, g bits of data $d_{k-3}$ are transferred on line 1702 and are clocked into the flip-flops 1704. The encoder 1708 is idle.

4) On the fourth clock cycle, g bits of data $d_{k-4}$ are transferred on line 1702 and are clocked into the flip-flops 1704. The 2g bits $d_{k-3}$ & $d_{k-4}$ (i.e. $d_{k-3}$ concatenated with $d_{k-4}$) are transferred on line 1706 to the encoder 1708, which performs an encoding iteration.

5) Continuing in this fashion, on odd numbered clock cycles, g bits are clocked into the flip-flops 1704 and the encoder 1708 is idle. On even numbered clock cycles, 2g bits are transferred on line 1706 to the encoder 1708, and the encoder 1708 performs an encoding iteration.

The 2g-bit data and parity symbols 1712 are clocked out of the encoder 1708 every other clock cycle.

Figure 18:
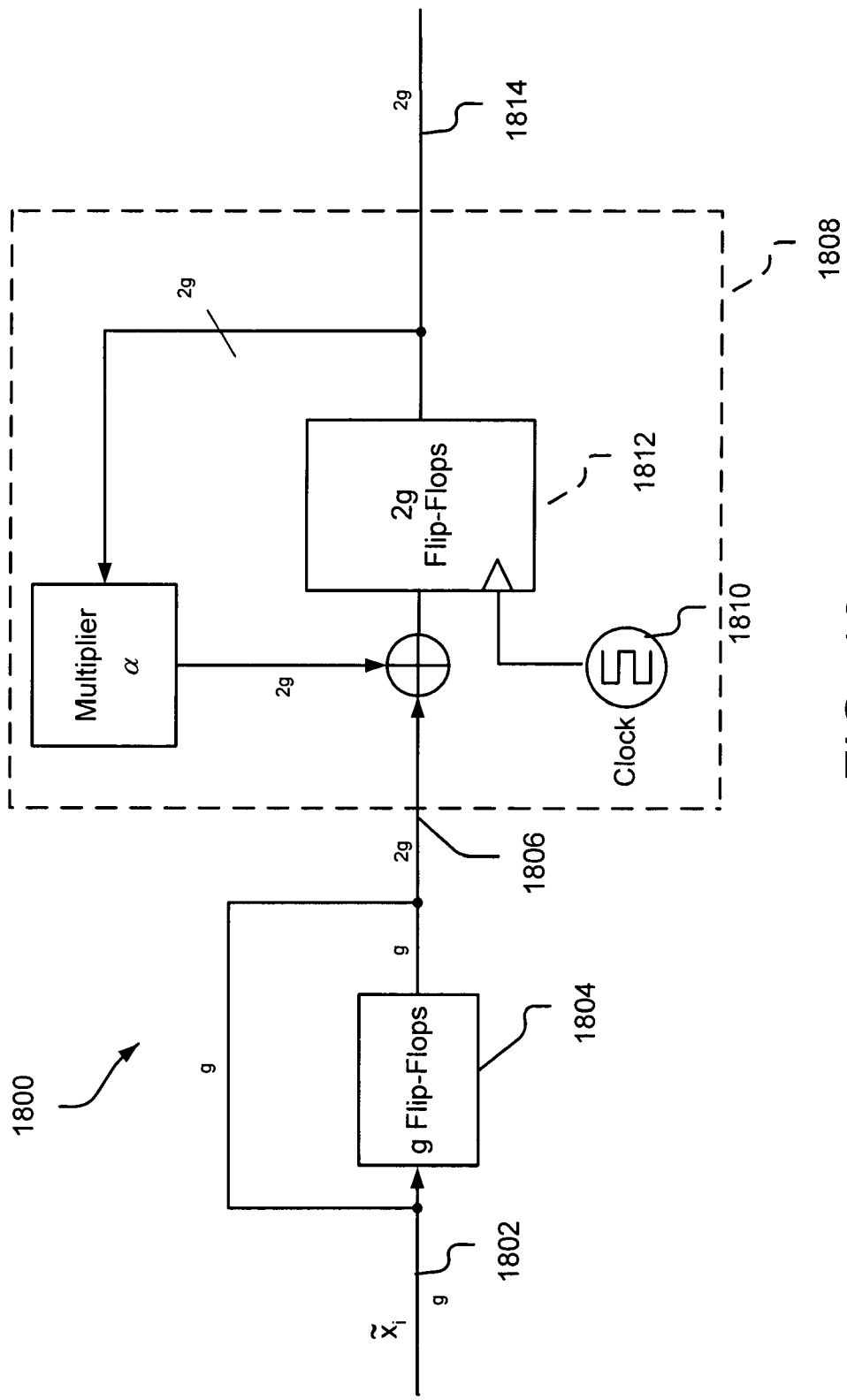
FIG. 18 is an exemplary EDC syndrome computer in accordance with another alternative embodiment of the present invention utilized in conjunction with the EDC encoder circuit of FIG. 17.

FIG. 18 illustrates a syndrome computation circuit 1800 in this system. Here, g bits on line 1802 are clocked in the flip-flops 1804 on every clock cycle. The bit symbols $\tilde{x}_i$ on line 1802 can be either (possibly corrupted) data symbols $\tilde{d}_i$ or (possibly corrupted) g-bit portions of EDC parity symbols $\tilde{P}_i$, since syndromes are computed from both the data and parity read from the disc. The 2g bits out of the flip-flops 1804 on line 1806 consist of the g bits from line 1802 concatenated with the g bits stored in the flip-flops 1804. In this embodiment, the block 1808 is a syndrome computer such as in the syndrome computer 700 in FIG. 7. The control signal 1810, in this case, causes the syndrome computer 1808 to operate on every other clock cycle. This circuit 1800 thus functions in the same way as the circuit in FIG. 17 in that 2g bits of data/parity are sent to the syndrome computer 1808 every other clock cycle. The circuit 1800 implements 2g-bit Homer evaluation in a g-bit system. A circuit of this type could be used for the computation of non-transformed EDC syndromes as the data and parity are read from the storage medium.

In more detail, the syndrome computer 1800 operates as follows:

1) On the first clock cycle, the value stored in the flip-flops 1812 is V=0 and g bits $\tilde{x}_{n-1}$ are transferred on 1802 and are clocked into the flip-flops 1804. The syndrome computer 1808 is idle.

2) On the second clock cycle, g bits $\tilde{x}_{n-2}$ are transferred on line 1802 and are clocked into the flip-flops 1804. The 2g bits $\tilde{x}_{n-1}$ & $\tilde{x}_{n-2}$ (i.e. $\tilde{x}_{n-1}$ concatenated with $\tilde{x}_{n-2}$) out of the flip-flops 1804 are transferred on line 1806 to the syndrome computer 1808, which performs an iteration in the Homer evaluation. The value clocked into the flip-flops 1812 is (0·α) XOR ($\tilde{x}_{n-1}$ & $\tilde{x}_{n-2}$)=($\tilde{x}_{n-1}$ & $\tilde{x}_{n-2}$).

3) On the third clock cycle, the value stored in the flip-flops 1812 is V=($\tilde{x}_{n-1}$ & $\tilde{x}_{n-2}$) and g bits $\tilde{x}_{n-3}$ are transferred on line 1802 and are clocked into the flip-flops 1804. The syndrome computer 1808 is idle.

4) On the fourth clock cycle, g bits $\tilde{x}_{n-4}$ are transferred on line 1802 and are clocked into the flip-flops 1804. The 2g bits $\tilde{x}_{n-3}$ & $\tilde{x}_{n-4}$ out of the flip-flops 1804 are transferred on line 1806 to the syndrome computer 1808, which performs an iteration in the Homer evaluation. The value clocked into the flip-flops 1812 is ($\tilde{x}_{n-1}$ & $\tilde{x}_{n-2}$)·αXOR($\tilde{x}_{n-3}$ & $\tilde{x}_{n-4}$).

5) Continuing in this fashion, on odd numbered clock cycles, g bits $\tilde{x}_{n-(2i-1)}$ are clocked into the flip-flops 1804 and the syndrome computer 1808 is idle. On even numbered clock cycles, 2g bits $\tilde{x}_{n-(2i-1)}$ & $\tilde{x}_{n-2i}$ are transferred on line 1806 to the syndrome computer 1808, which performs an iteration. If the previous value stored in the flip-flops was V, then the new value stored in the flip-flops 1812 after the iteration will be (V·α)XOR($\tilde{x}_{n-(2i-1)}$ & $\tilde{x}_{n-2i}$). This is the syndrome output that will be seen on line 1814.

The 2g-bit syndrome on line 1814 can be sampled after all data and parity symbols have been processed by the syndrome computer 1800.

Figure 21:
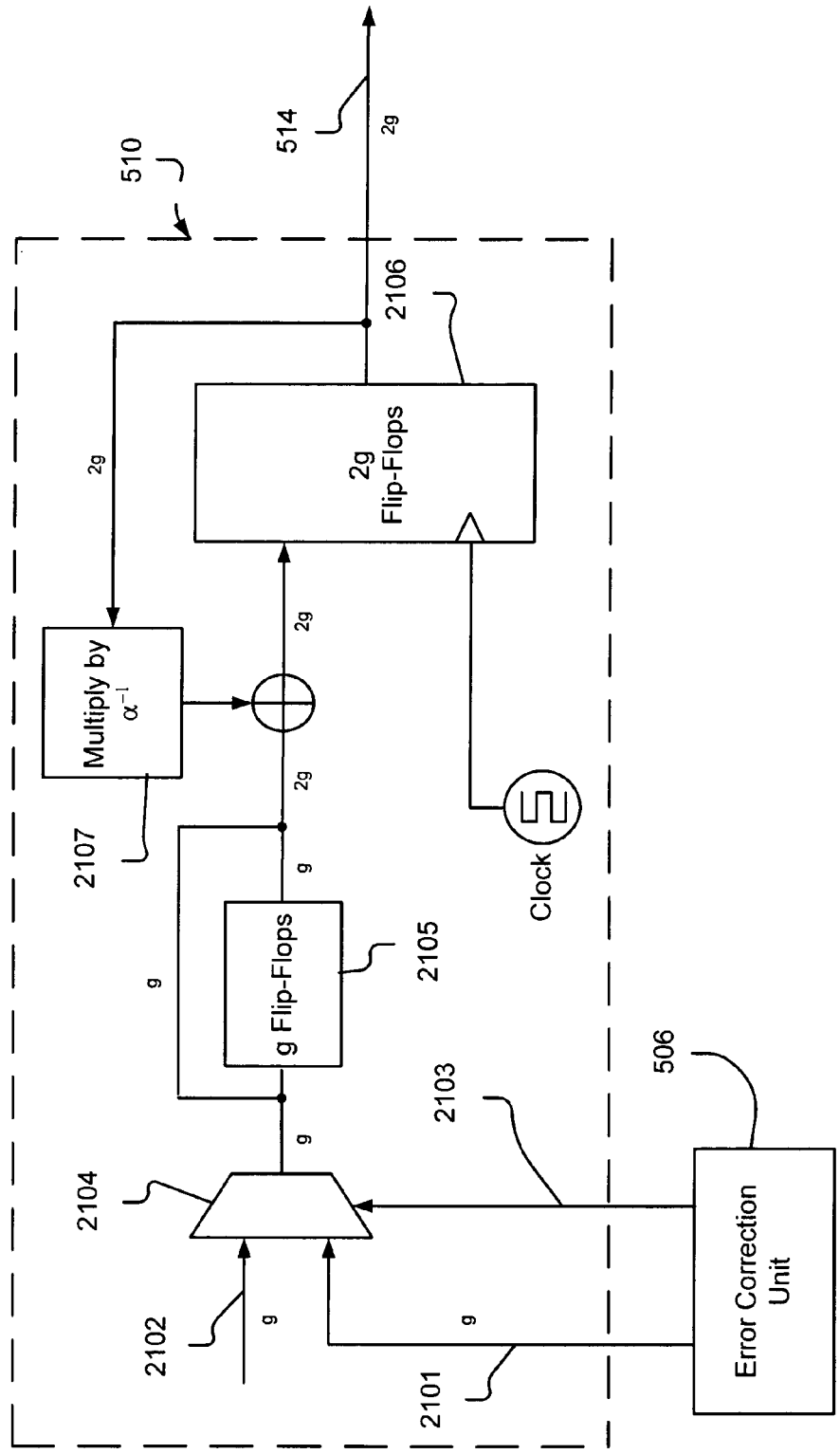
FIG. 21 is a transformed EDC syndrome recomputing circuit in accordance with another embodiment of the present invention.

Another circuit of this type could be used for the recomputation of the transformed EDC syndromes from the error values and locations computed by the Chien search as in FIG. 9. Such a circuit is illustrated in FIG. 21. Since the ECC uses g-bit symbols, the error values computed by the Error Correction Unit 506 (see FIG. 9) will also have g bits. These g-bit error values must be concatenated to create the 2g-bit error values corresponding to errors in the 2g-bit symbols used by the EDC. FIG. 21 is nearly identical to FIG. 9 except that the line 905 is replaced by circuitry that concatenates the g-bit error values and sends 2g bits to the Homer evaluation circuit every other clock cycle.

Figure 19:
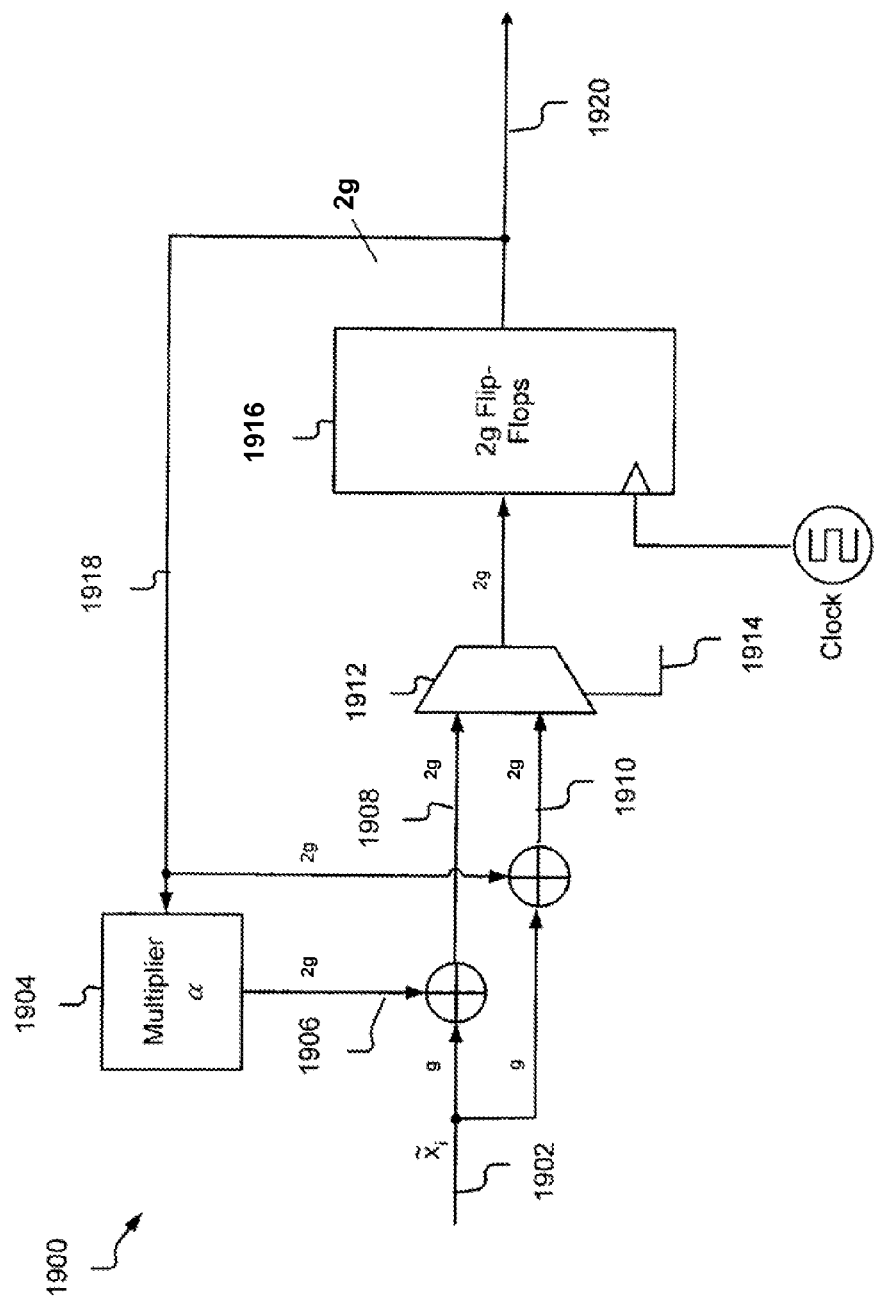
FIG. 19 is an alternative EDC syndrome computer circuit.

Another way of computing the EDC syndromes is shown in FIG. 19. As in FIG. 18, a g-bit symbol $\tilde{x}_i$, which may be a (possibly corrupted) data symbol $\tilde{d}_i$ or a (possibly corrupted) g-bit portion of an EDC parity symbol $\tilde{P}_i$, is transferred on line 1902 and 2g bits, representing a Galois field value V, are stored in a bank of 2g flip-flops 1916. The value V is transferred on line 1918 to a constant multiplier 1904, whose output 1906 is a 2g-bit value V·a. The symbol $\tilde{x}_i$ is XORed into the first g bits of the 2g-bit value 1906, so that the value transferred on line 1908 is $V_0$=V·αXOR($\tilde{x}_i$ & 0), where the "0" in the formula represents g bits all with the value 0. Similarly, the symbol $\tilde{x}_i$ is XORed into the second g bits of the 2g-bit value 1918, so that the value transferred on line 1910 is $V_1$=V XOR(0 & $\tilde{x}_i$), where the "0" in the formula represents g bits all with the value 0. The values $V_0$ and $V_1$ are the inputs to a multiplexor 1912 and the value which is clocked into the bank of flip-flops 1916 is determined by the control signal 1914.

In more detail, the syndrome computer 1900 operates as follows: 1) On the first clock cycle, the value stored in the flip-flops 1916 is V=0 and g bits $\tilde{x}_{n-1}$ are transferred on line 1902. On this clock cycle the value passed through the multiplexor 1912 and clocked into the flip-flops 1916 is the signal on line 1908, namely $V_0$=V·αXOR($\tilde{x}_{n-1}$ & 0)=0·αXOR($\tilde{x}_{n-1}$ & 0)=($\tilde{x}_{n-1}$ & 0).

2) On the second clock cycle, the value stored in the flip-flops 1916 is V=($\tilde{x}_{n-1}$ & 0) and g bits $\tilde{x}_{n-2}$ are transferred on line 1902. On this clock cycle the value clocked into the flip-flops 1916 is the signal on line 1910, namely $V_1$=V XOR(0 & $\tilde{x}_{n-2}$)=($\tilde{x}_{n-1}$ &0)XOR(0 & $\tilde{x}_{n-2}$)=$\tilde{x}_{n-1}$ & $\tilde{x}_{n-2}$. This is the same value clocked into the flip-flops 1812 in FIG. 18 on the second clock cycle.

3) On the third clock cycle, the value stored in the flip-flops 1916 is $V=(\tilde{x}_{n-1} \& \tilde{x}_{n-2})$ and g bits $\tilde{x}_{n-3}$ are transferred on line 1902. On this clock cycle the value and clocked into the flip-flops 1916 is the signal on line 1908, namely $V_0 = V \cdot \alpha XOR(\tilde{x}_{n-3} \& 0) = (\tilde{x}_{n-1} \& \tilde{x}_{n-2}) \cdot \alpha XOR(\tilde{x}_{n-3} \& 0)$.

4) On the fourth clock cycle, the value stored in the flip-flops 1916 is $V=(\tilde{x}_{n-1} \& \tilde{x}_{n-2}) \cdot \alpha XOR(\tilde{x}_{n-3} \& 0)$ and g bits $\tilde{x}_{n-4}$ are transferred on line 1902. On this clock cycle the value clocked into the flip-flops 1916 is the signal on line 1910, namely $V_1 = V\ XOR(0 \& \tilde{x}_{n-4}) = ((\tilde{x}_{n-1} \& \tilde{x}_{n-2}) \cdot \alpha XOR(\tilde{x}_{n-3} \& 0))XOR(0 \& \tilde{x}_{n-4}) = (\tilde{x}_{n-1} \& \tilde{x}_{n-2}) \cdot \alpha XOR(\tilde{x}_{n-3} \& \tilde{x}_{n-4})$. This is the same value clocked into the flip-flops 1812 in FIG. 18 on the fourth clock cycle.

5) Continuing in this fashion, the value clocked into the flip-flops 1916 on even numbered clock cycles will be the same as the value clocked into the flip-flops 1812 in FIG. 18 on the corresponding clock cycle. Hence, the circuit in FIG. 19 computes the same 2g-bit syndrome value as the circuit in FIG. 18.

The 2g-bit syndrome output on line 1920 can be sampled after all data and parity symbols have been processed by the syndrome computer.

Interleaving

Interleaving is a technique by which user data are distributed over multiple coding blocks in such a way that error bursts (i.e. symbol errors in a number of consecutive symbols) are distributed among the various coding blocks. For example, if 512 data bytes $d_{511}, d_{510}, \ldots, d_1, d_0$ (listed in the order in which they are written to and read from the storage medium) are encoded using 3 interleaves, the user data can be thought of as being arranged in the following two-dimensional format:

| | | |
|---|---|---|
| $d_{511}$ | $d_{510}$ | $d_{509}$ |
| $d_{508}$ | $d_{507}$ | $d_{506}$ |
| ... | ... | ... |
| $d_4$ | $d_3$ | $d_2$ |
| $d_1$ | $d_0$ | |

Thus, the data are written/read from left to right, then from top to bottom. Each column of the array is viewed as a separate data block to be encoded in its own independent codeword. Thus, there are three blocks of data to be encoded, namely (a) $d_{511}, d_{508}, \ldots, d_4, d_1$, (b) $d_{510}, d_{507}, \ldots, d_3, d_0$, and (c) $d_{509}, d_{506}, \ldots, d_5, d_2$. In the two-dimensional format the ECC parity for each column is typically appended to the bottom of that column, again with ECC parity symbols being read from left to right and then from top to bottom:

| | | |
|---|---|---|
| $d_{511}$ | $d_{510}$ | $d_{509}$ |
| $d_{508}$ | $d_{507}$ | $d_{506}$ |
| ... | ... | ... |
| $d_4$ | $d_3$ | $d_2$ |
| $d_1$ | $d_0$ | ECC |
| ECC | ECC | ECC |
| ... | ... | ... |
| ECC | ECC | ECC |
| ECC | ECC | |

Another variation of the present invention is a coding system in which the EDC works with 2g-bit symbols and the ECC is an interleaved code which works with g-bit symbols. For the purposes of EDC encoding and (non-transformed) EDC syndrome computation, this is simply a 2g-bit EDC in a g-bit system and the methods described above will suffice, regardless of the number of interleaves. The method used for the recomputation of the transformed EDC syndromes from the computed error values depends on the number of interleaves. The case of two interleaves will be described in detail below.

The user data and EDC parity are partitioned into 2g-bit symbols for the purposes of EDC coding and are partitioned into g-bit symbols for the purposes of ECC coding and error correction. (As before, it can be assumed that there are an even number of g-bit user data symbols.) Following the indexing scheme in the notation used above, both data and (g-bit portions of) EDC parity symbols will be written as $x_i^{(j)}$, where j denotes the interleave number. The g-bit symbols, in the order that they are written to the disc are $x_{n-1}^{(0)}, x_{n-1}^{(1)}, x_{n-2}^{(0)}, x_{n-2}^{(1)}, \ldots, x_1^{(0)}, x_1^{(1)}, x_0^{(0)}, x_0^{(1)}$. The 2g-bit symbols making up the EDC codeword are $(x_{n-1}^{(0)} \& x_{n-1}^{(1)})$, $(x_{n-2}^{(0)} \& x_{n-2}^{(1)}), \ldots, (x_1^{(0)} \& x_1^{(1)}), (x_0^{(0)} \& x_0^{(1)})$. The interleaved g-bit symbols have the following two-dimensional representation:

| | |
|---|---|
| $x_{n-1}^{(0)}$ | $x_{n-1}^{(0)}$ |
| $x_{n-2}^{(0)}$ | $x_{n-2}^{(1)}$ |
| ... | ... |
| $x_1^{(0)}$ | $x_1^{(1)}$ |
| $x_0^{(0)}$ | $x_0^{(1)}$ |

The symbols in interleave 0 (resp. 1) all have a superscript (0) (resp. (1)). After the ECC parity symbols have been appended, the data and parity have the following two-dimensional representation:

| | |
|---|---|
| $x_{n-1}^{(0)}$ | $x_{n-1}^{(0)}$ |
| $x_{n-2}^{(0)}$ | $x_{n-2}^{(1)}$ |
| ... | ... |
| $x_1^{(0)}$ | $x_1^{(1)}$ |
| $x_0^{(0)}$ | $x_0^{(1)}$ |
| ECC | ECC |
| ... | ... |
| ECC | ECC |

When the g-bit symbols $x_i^{(j)}$ are read from the storage medium, they may be corrupted and the possibly corrupted symbols will be written as $\tilde{x}_i^{(j)} = x_i^{(j)} + e_i^{(j)}$, where $e_i^{(j)}$ is the error value and "+" denotes bitwise XOR. The non-transformed EDC syndromes are computed from the corrupted symbols $\tilde{x}_i^{(j)}$ and the transformed syndromes are computed first from then EDC syndromes, then are recomputed from the computed error values.

Since, the EDC codeword polynomial is $(x_{n-1}^{(0)} \& x_{n-1}^{(1)})x^{n-1} + (x_{n-2}^{(0)} \& x_{n-2}^{(1)})x^{n-2} + \ldots + (x_1^{(0)} \& x_1^{(1)})x + (x_0^{(0)} \& x_0^{(1)})$, the transformed EDC syndrome is $S = (\tilde{x}_0^{(0)} \& \tilde{x}_0^{(1)})\alpha^{-(n-1)} + (\tilde{x}_1^{(0)} \& \tilde{x}_1^{(1)})\alpha^{-(n-2)} + \ldots + (\tilde{x}_{n-2}^{(0)} \& \tilde{x}_{n-2}^{(1)})\alpha^{-1} + (\tilde{x}_{n-1}^{(0)} \& \tilde{x}_{n-1}^{(1)})$.

The value of the transformed syndrome S is unchanged when the corrupted symbol $\tilde{x}_i^{(j)}$ is replaced by the error value $e_i^{(j)}$, so that $S = (e_0^{(0)} \& e_0^{(1)})\alpha^{-(n-1)} + (e_1^{(0)} \& e_1^{(1)})\alpha^{-(n-2)} + \ldots + (e_{n-2}^{(0)} \& e_{n-2}^{(1)})\alpha^{-1} + (e_{n-1}^{(0)} \& e_{n-1}^{(1)})$.

The transformed EDC syndrome can be written as $S=S_0+S_1$, where $$S_0 = (e_0^{(0)} \& 0)\alpha^{-(n-1)} + (e_1^{(0)} \& 0)\alpha^{-(n-2)} + \ldots + (e_{n-2}^{(0)} \& 0)\alpha^{-1} + (e_{n-1}^{(0)} \& 0) \text{ and}$$

$$S_1 = (0 \& e_0^{(1)})\alpha^{-(n-1)} + (0 \& e_1^{(1)})\alpha^{-(n-2)} + \ldots + (0 \& e_{n-2}^{(1)})\alpha^{-1} + (0 \& e_{n-1}^{(1)}).$$

The value $S_0$ can be thought of as the contribution from interleave 0 and the value $S_1$ as the contribution from interleave 1.

Since the interleaves are independent codewords, corrections are computed on an interleave by interleave basis. First the error values for interleave 0 are computed in the following order: $e_0^{(0)}$, $e_1^{(0)}$, ... $e_{n-2}^{(0)}$, $e_{n-1}^{(0)}$. The sum $S_0$ will be computed as the error values $e_i^{(0)}$ are computed by the correction logic. Next the error values for interleave 1 are computed in the following order: $e_0^{(1)}$, $e_1^{(1)}$, ... $e_{n-2}^{(1)}$, $e_{n-1}^{(1)}$. The sum $S_1$ will be computed as the error values $e_i^{(1)}$ are computed. After both $S_0$ and $S_1$ have been computed, they are summed to give the transformed EDC syndrome.

Figure 20:
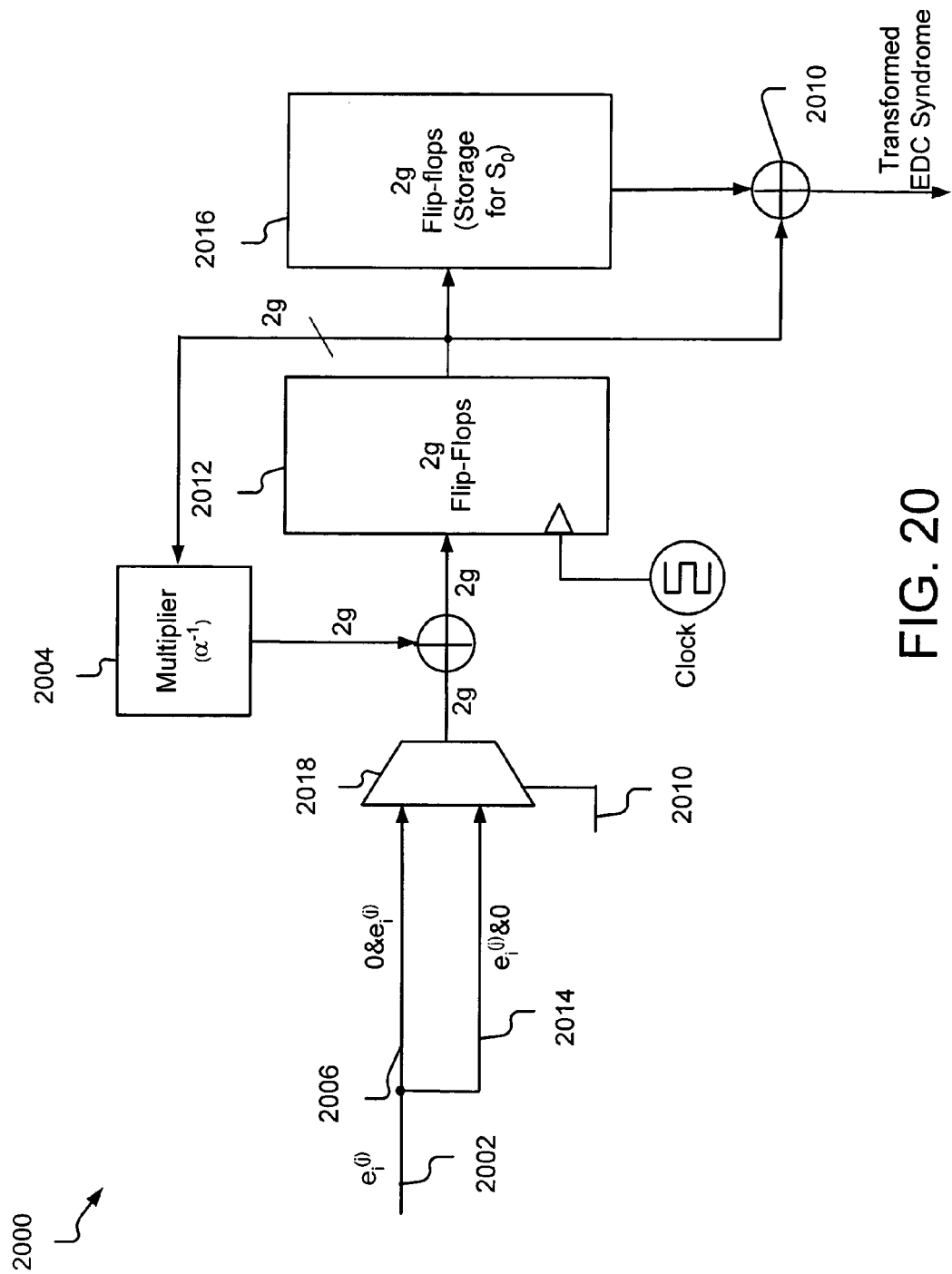
FIG. 20 is an alternative transformed EDC syndrome computer circuit in accordance with the present invention.

FIG. 20 illustrates a circuit 2000 that computes $S_0$, then $S_1$, then the transformed EDC syndrome $S=S_0+S_1$. $S_0$ and $S_1$ are computed by Homer's algorithm. Error values $e_i^{(j)}$ are received from the error correction unit 506 (FIG. 5) on the line 2002. These g-bit values are concatenated with g zeroes in two ways: the 2g-bit value $0 \& e_i^{(j)}$ is transferred on line 2006 and the 2g-bit value $e_i^{(j)} \& 0$ is transferred on line 2014. Both values are the inputs to a multiplexor 2018, whose output is controlled by a signal 2010 in such a way that $e_i^{(0)} \& 0$ is the output during the computation of $S_0$ and $0 \& e_i^{(1)}$ is the output during the computation of $S_1$. The outputs of the multiplexor 2018 are the inputs to a standard circuit implementing Homer's algorithm. The Homer circuit consists of flip-flops 2012 and a constant multiplier 2004. After $S_0$ has been computed, that value is stored in the flip-flops 2016. After $S_1$ has been computed, it is XORed with (i.e. added to) the value stored in 2016 and the resulting value is the recomputed transformed EDC syndrome.

In more detail:

1) The flip-flops 2012 are given 0 as their initial value.

2) The value $e_0^{(0)}$ is transferred on line 2002 and the value $e_0^{(0)} \& 0$ on line 2006 passes through the multiplexor 2018 to the Homer evaluation circuit. The value $0 \cdot \alpha^{-1} + (e_0^{(0)} \& 0)$ is clocked into the flip-flops 2012.

3) The value $e_1^{(0)}$ is transferred on line 2002 and the value $e_1^{(0)} \& 0$ on line 2006 passes through the multiplexor 2018 to the Homer evaluation circuit. The value $(e_0^{(0)} \& 0) \cdot \alpha^{-1} + (e_1^{(0)} \& 0)$ is clocked into the flip-flops 2012.

4) This process continues until the value $e_{n-1}^{(0)}$ is transferred on line 2002 and the value $e_{n-1}^{(0)} \& 0$ on line 2006 passes through the multiplexor 2018 to the Homer evaluation circuit. The value $S_0$ is clocked into the flip-flops 2012 and on the next clock cycle is transferred into the flip-flops 2016.

5) The flip-flops 2012 are again given 0 as their initial value.

6) The value $e_0^{(1)}$ is transferred on line 2002 and the value $0 \& e_0^{(1)}$ on line 2006 passes through the multiplexor 2018 to the Homer evaluation circuit. The value $0 \cdot \alpha^{-1} + (0 \& e_0^{(1)})$ is clocked into the flip-flops 2012.

7) The value $e_1^{(1)}$ is transferred on line 2002 and the value $0 \& e_1^{(1)}$ on line 2006 passes through the multiplexor 2018 to the Homer evaluation circuit. The value $(0 \& e_0^{(1)}) \cdot \alpha^{-1} + (0 \& e_1^{(1)})$ is clocked into the flip-flops 2012.

8) This process continues until the value $e_{n-1}^{(1)}$ is transferred on line 2002 and the value $0 \& e_{n-1}^{(1)}$ on line 2006 passes through the multiplexor 2018 to the Homer evaluation circuit. The value $S_1$ is clocked into the flip-flops 2012 and on the next clock cycle the transformed EDC syndrome $S=S_0+S_1$ can be transferred out from the circuit 2000.

Other alternative embodiments of the present invention are envisioned. For example, the above description of a third degree interleaved methodology can be expanded, to a four, five, six, and so on to an $n^{th}$ degree of interleaving. Further, the present invention may be implemented in any storage or communication device that employs an error-control coding algorithm based on Galois Fields. For example, the present invention may be implemented in a magnetic tape storage device. Numerous other changes may be made which will readily suggest themselves to those skilled in the art and which are encompassed in the spirit of the invention disclosed and as defined in the appended claims.

What is claimed is:

1. A method comprising steps of:
    calculating a transformed error detection code syndrome from data having an error detection code appended to user data, wherein the transformed error detection code syndrome is calculated using a second polynomial;
    calculating a recomputed transformed error detection code syndrome, wherein the recomputed transformed error detection code syndrome is calculated using a first polynomial and a correction pattern for the data;
    comparing the recomputed transformed error detection code syndrome to the transformed error detection code syndrome; and
    if the recomputed transformed error detection code syndrome corresponds to the transformed error detection code syndrome, transferring the data.

2. The method of claim 1 further comprising steps of:
    if the recomputed transformed error detection code syndrome does not correspond to the transformed error detection code syndrome, receiving the data again.

3. The method of claim. 1, wherein the transformed error detection code syndrome recomputation step comprises steps of:
    computing a correction pattern using a Chien search in conjunction with Forney's algorithm.

4. The method of claim 1, wherein the transformed error detection code syndrome calculating step comprises steps of:
    generating an error detection code multiplier;
    generating a non-transformed error detection code syndrome; and
    multiplying the error detection code multiplier by the non-transformed error detection code syndrome.

5. The method of claim 1 wherein the step of calculating a recomputed transformed error detection code syndrome is performed only if the transformed EDC syndrome is nonzero.

6. The method of claim 5 wherein if the transformed EDC syndrome is zero, then the transmitted data is transmitted to the host.

7. The method of claim 1, wherein the error detection code includes a first portion with a first symbol size and a second portion with a second symbol size, wherein the second symbol size is different from the first symbol size.

8. The method of claim 1, wherein the second polynomial has coefficients of the first polynomial in a reversed order.

9. A method of detecting an error in error correction code (ECC) interleave encoded data comprising steps of:
    receiving ECC interleave encoded data, the ECC interleave encoded data comprising user data and an error detection code (EDC);
    calculating a transformed error detection code syndrome using the ECC interleave encoded data and a second polynomial;

generating a recomputed transformed error detection syndrome using a first polynomial and a computed correction pattern for the ECC interleave encoded data; and comparing the transformed EDC syndrome with the recomputed transformed error detection syndrome.

10. The method of claim 9 further comprising a step of:

locating errors either in the received data using an error locator; and correcting errors in the received data using an error evaluator.

11. The method of claim 10 wherein the locating step comprises performing a Chien search using the received data and the evaluating step comprises performing Forney's algorithm.

12. The method of claim 9, wherein the transforming step comprises:

generating a non-transformed EDC syndrome;

computing an EDC multiplier; and multiplying the non-transformed EDC syndrome by the EDC multiplier to generate the transformed EDC syndrome.

13. The method of claim 12, wherein the step of generating a non-transformed EDC syndrome generator comprises:

receiving the data;

providing clocked flip-flops;

multiplying an output of the flip-flops with a value associated with the error detection code in the received data; and logically adding the multiplied output to the received data.

14. The method of claim 9 further comprising steps of:

generating an error correction code (ECC) syndrome from the received data in an ECC syndrome generator.

15. The method of claim 14 wherein the ECC syndrome generator is connected to a comparator trough an error correction unit.

16. The method of claim 15 wherein the error correction unit is connected to the comparator through an EDC syndrome recomparator.

* * * * *